US011910598B2

(12) United States Patent
Luo et al.

(10) Patent No.: US 11,910,598 B2
(45) Date of Patent: Feb. 20, 2024

(54) MICROELECTRONIC DEVICES INCLUDING SUPPORT PILLAR STRUCTURES, AND RELATED MEMORY DEVICES

(71) Applicant: Micron Technology, Inc., Boise, ID (US)

(72) Inventors: Shuangqiang Luo, Boise, ID (US); Indra V. Chary, Boise, ID (US); Justin B. Dorhout, Boise, ID (US)

( * ) Notice: Subject to any disclaimer, the term of this patent is extended or adjusted under 35 U.S.C. 154(b) by 0 days.

(21) Appl. No.: 17/816,299

(22) Filed: Jul. 29, 2022

(65) Prior Publication Data
US 2022/0367500 A1 Nov. 17, 2022

Related U.S. Application Data

(63) Continuation of application No. 16/908,287, filed on Jun. 22, 2020, now Pat. No. 11,417,673.

(51) Int. Cl.
*H10B 41/27* (2023.01)
*G11C 5/02* (2006.01)
*H01L 23/00* (2006.01)
*H01L 23/538* (2006.01)
*H01L 21/768* (2006.01)
(Continued)

(52) U.S. Cl.
CPC ............ *H10B 41/27* (2023.02); *G11C 5/025* (2013.01); *G11C 5/06* (2013.01); *H01L 21/76838* (2013.01); *H01L 23/5386* (2013.01); *H01L 24/14* (2013.01); *H10B 43/27* (2023.02)

(58) Field of Classification Search
CPC ........ H10B 41/27; H10B 43/27; G11C 5/025; G11C 5/06; H01L 21/76838; H01L 23/5386; H01L 24/14; H01L 27/11556; H01L 27/11582

USPC .......................................................... 257/773
See application file for complete search history.

(56) References Cited

U.S. PATENT DOCUMENTS 9,064,576 B2   6/2015   Tanzawa
9,899,406 B2   2/2018   Kim et al.
9,941,209 B2   4/2018   Tessariol et al.
(Continued)

OTHER PUBLICATIONS

International Search Report for Application No. PCT/US2021/035748, dated Nov. 1, 2021, 3 pages.
(Continued)

*Primary Examiner* — Tu-Tu V Ho
(74) *Attorney, Agent, or Firm* — TraskBritt

(57) ABSTRACT

A microelectronic device comprises a stack structure comprising alternating conductive structures and insulative structures arranged in tiers, the tiers individually comprising one of the conductive structures and one of the insulative structures, first support pillar structures extending through the stack structure within a first region of the microelectronic device, the first support pillar structures electrically isolated from a source structure underlying the stack structure, second support pillar structures extending through the stack structure within a second region of the microelectronic device, the second support pillar structures comprising an electrically conductive material in electrical communication with the source structure, and bridge structures extending between at least some neighboring first support pillar structures of the first support pillar structures. Related memory devices, electronic systems, and methods are also described.

15 Claims, 16 Drawing Sheets

(51) Int. Cl.
    *G11C 5/06*     (2006.01)
    *H10B 43/27*     (2023.01)

(56) References Cited

U.S. PATENT DOCUMENTS

| | | |
|---|---|---|
| 10,141,330 B1 | 11/2018 | Lindsay et al. |
| 10,269,626 B2 | 4/2019 | Ha et al. |
| 10,381,080 B2 | 8/2019 | Pan et al. |
| 10,580,795 B1 | 3/2020 | Luo et al. |
| 10,629,616 B1 | 4/2020 | Kai et al. |
| 2016/0343727 A1 | 11/2016 | Kim et al. |
| 2016/0365351 A1 | 12/2016 | Nishikawa et al. |
| 2019/0139974 A1 | 5/2019 | Sugawara et al. |
| 2020/0194450 A1 | 6/2020 | Pachamuthu et al. |
| 2020/0312863 A1* | 10/2020 | Iwai .................. H10B 43/10 |

OTHER PUBLICATIONS

Written Opinion of the International Searching Authority for Application No. PCT/US2021/035748, dated Nov. 1, 2021, 2 pages.

* cited by examiner

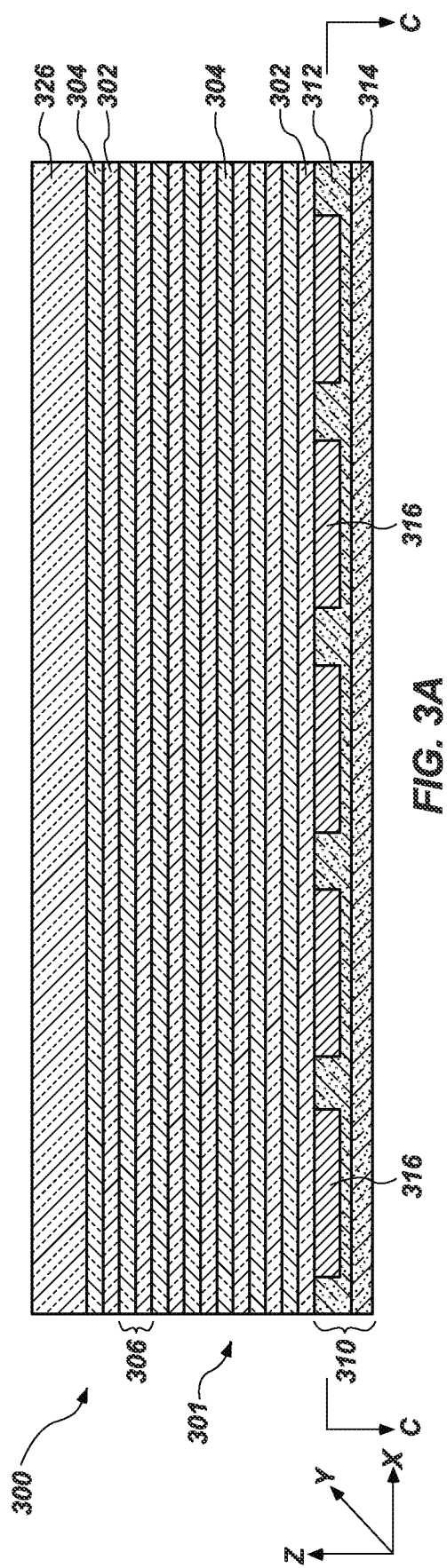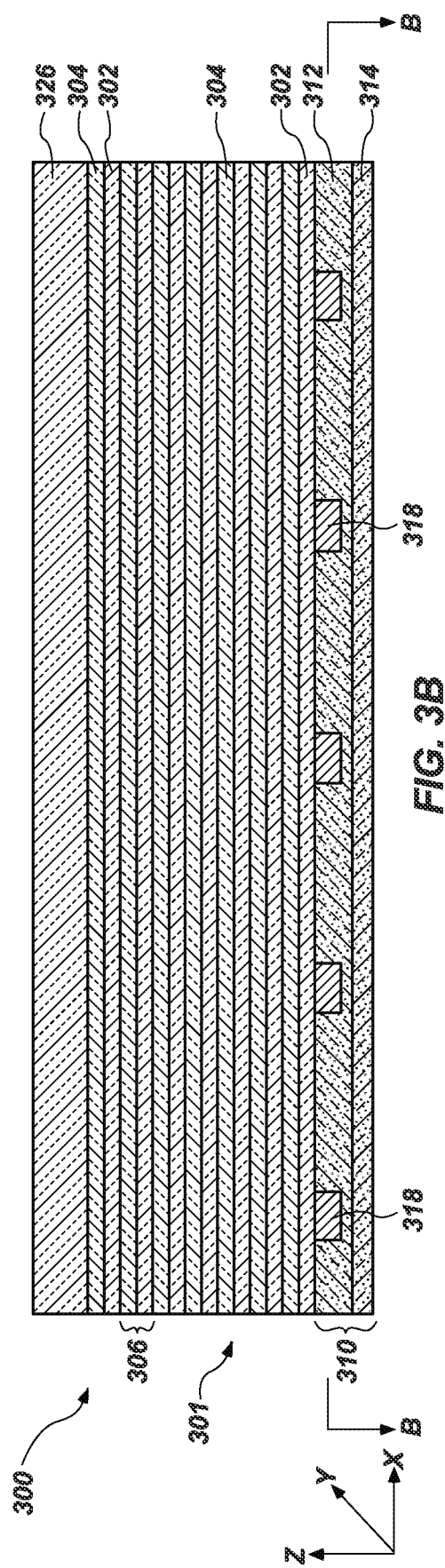

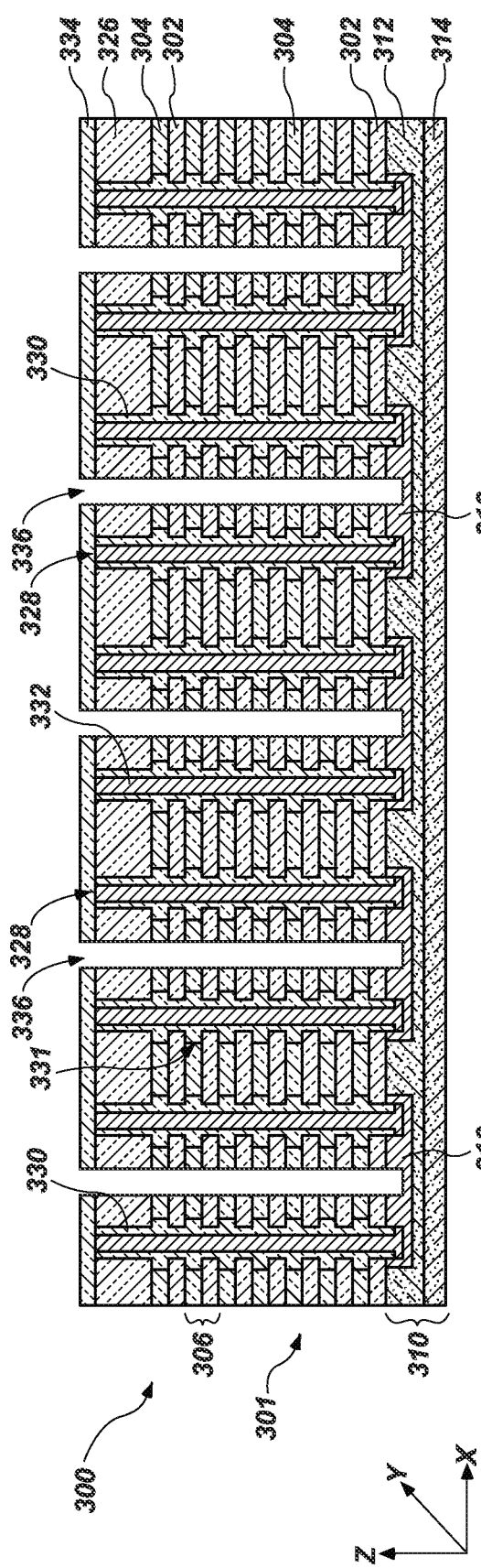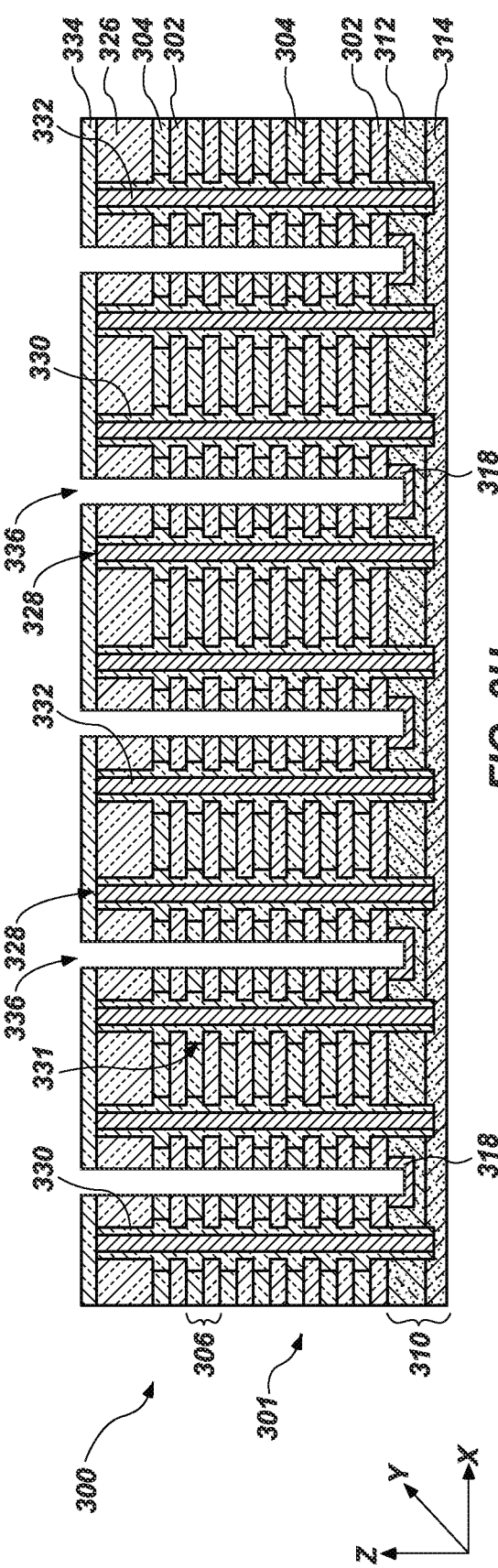
FIG. 3G
FIG. 3H

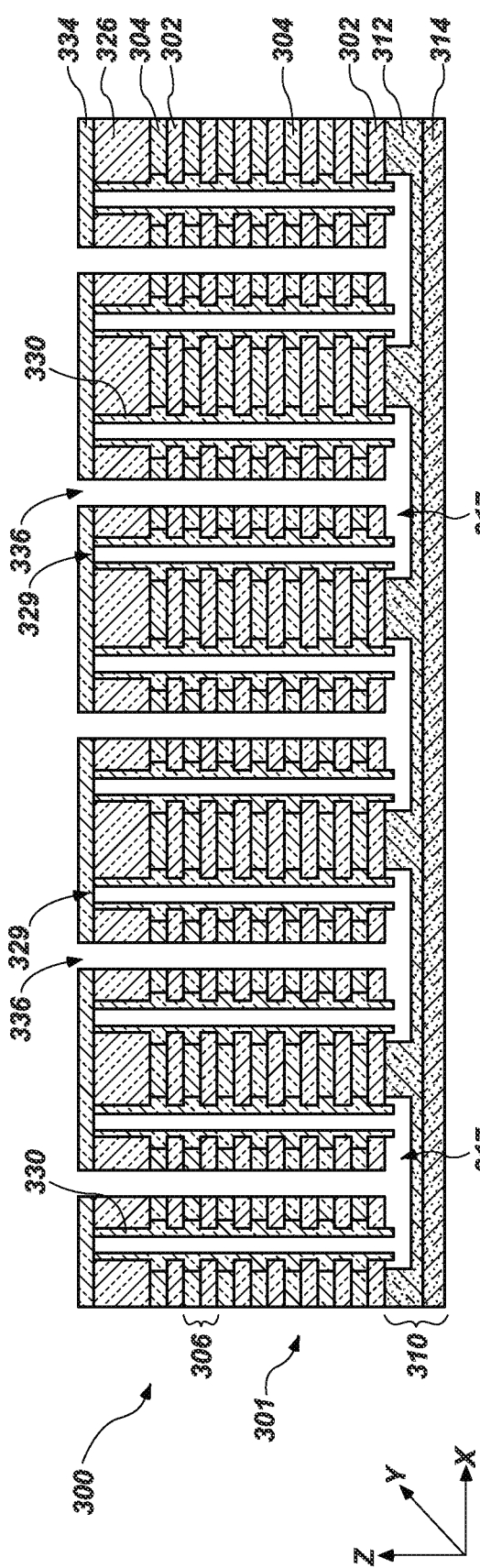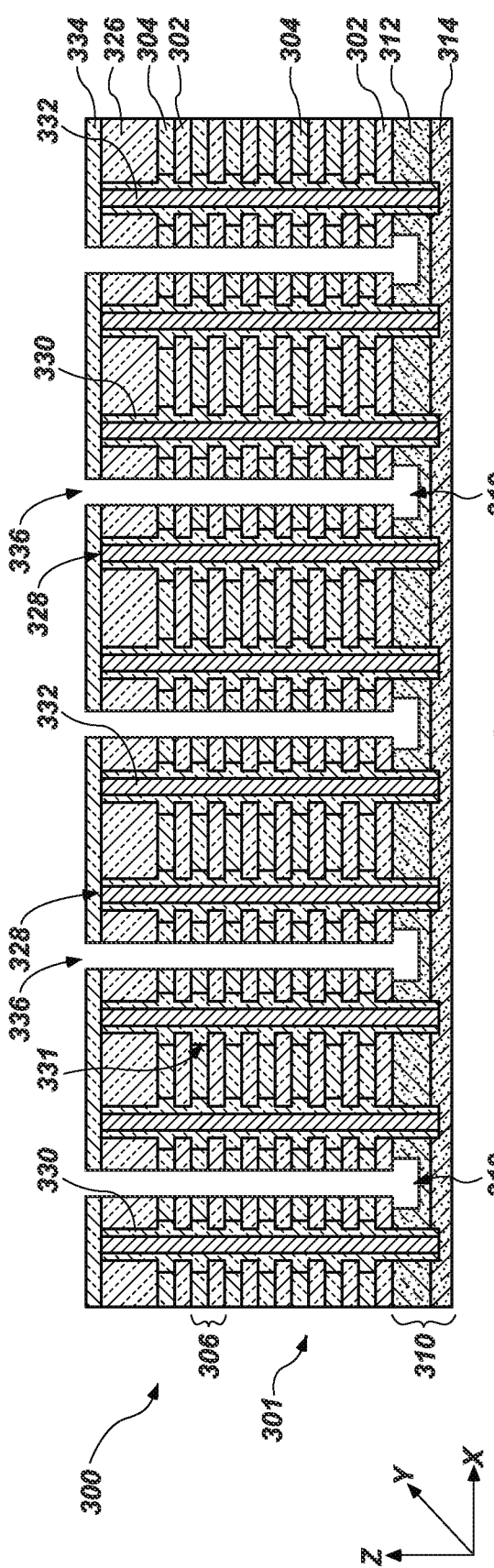
FIG. 3I
FIG. 3J

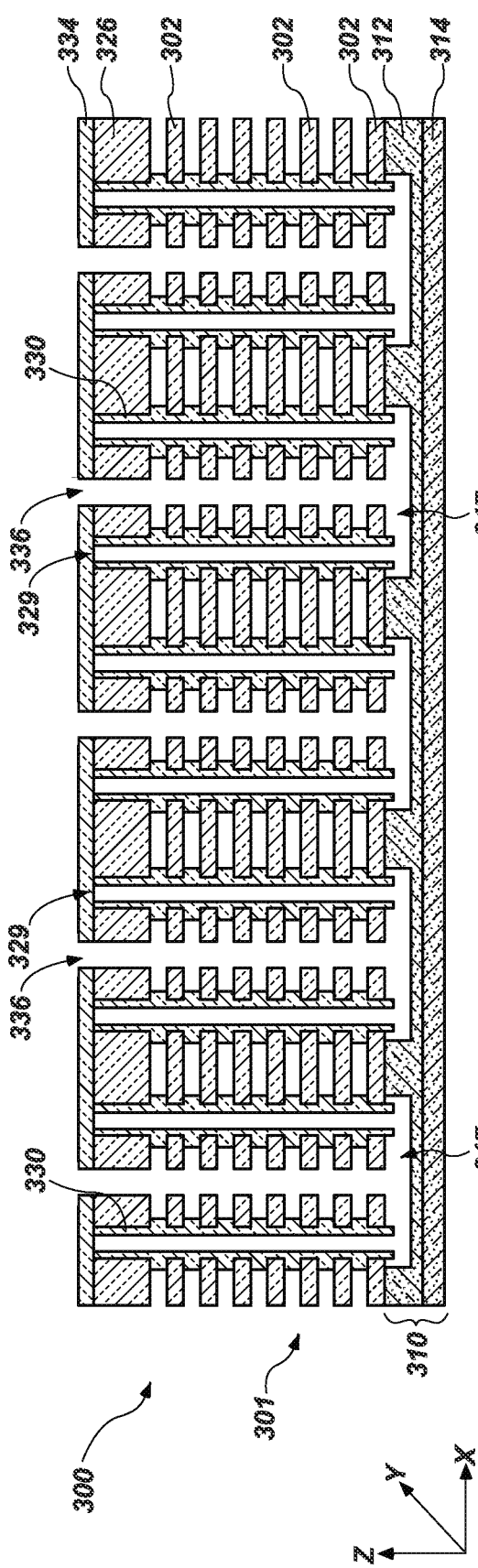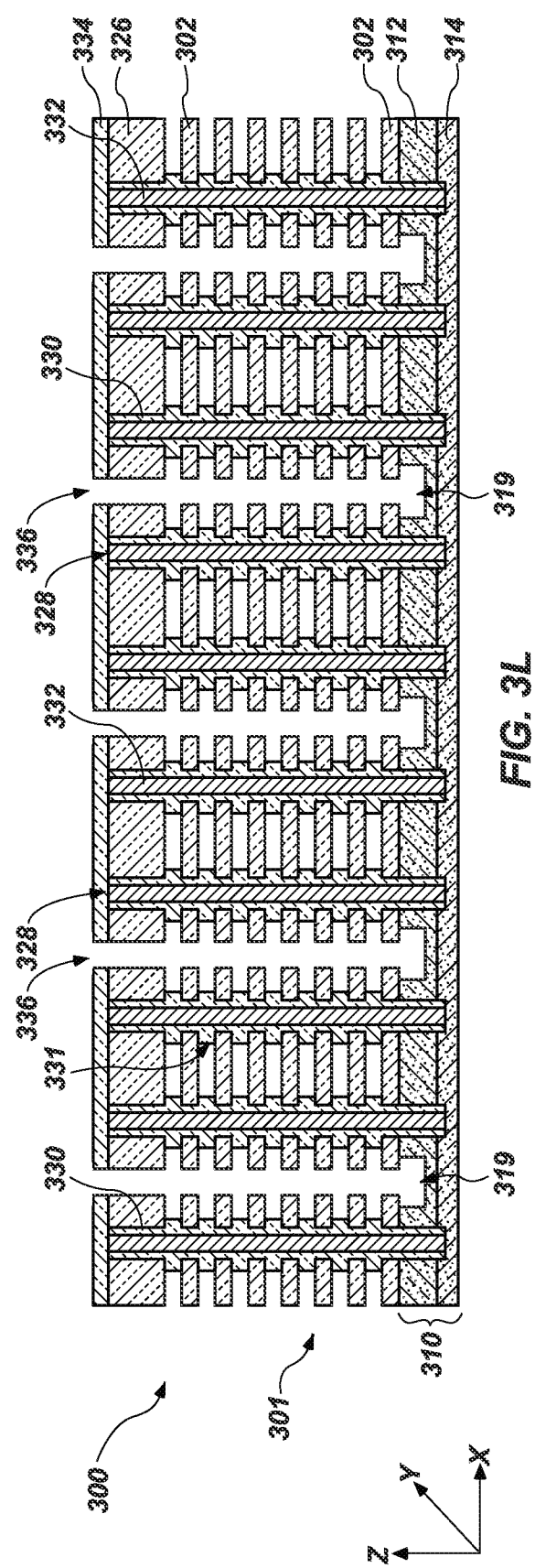

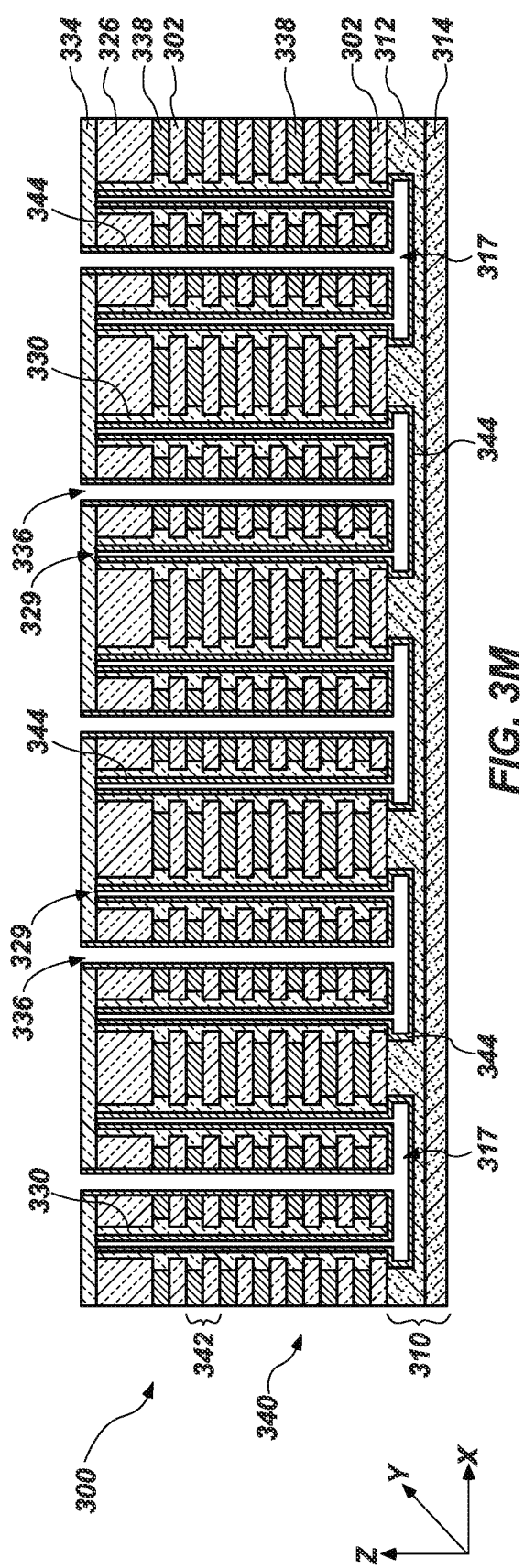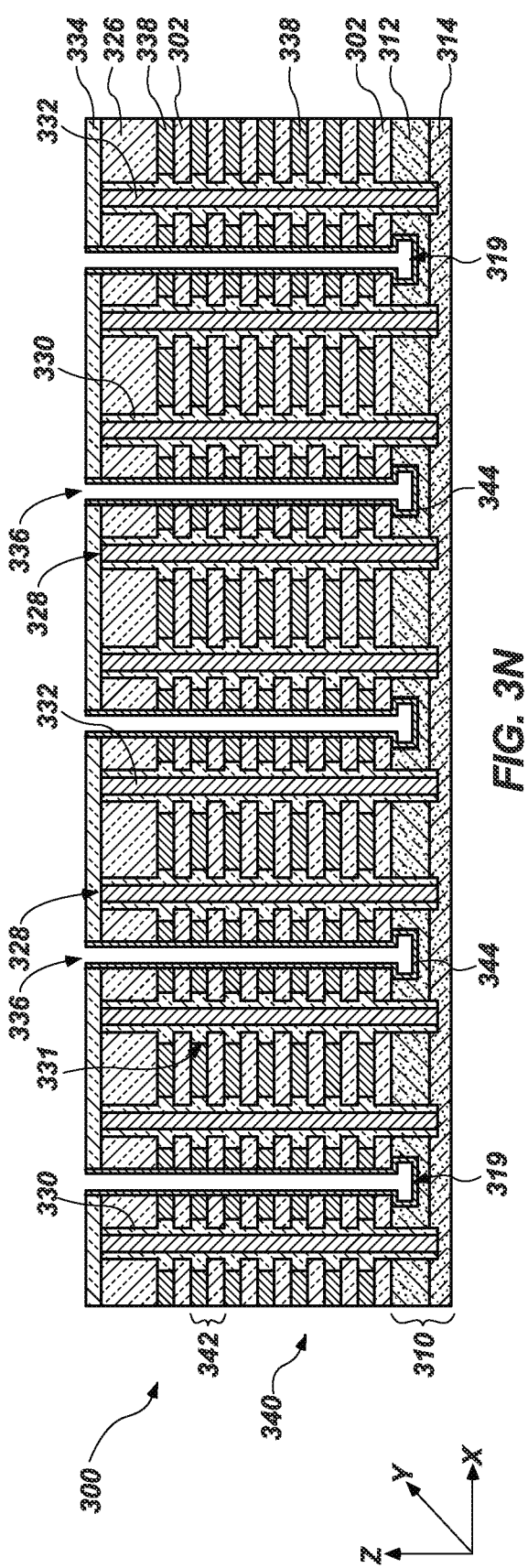

MICROELECTRONIC DEVICES INCLUDING SUPPORT PILLAR STRUCTURES, AND RELATED MEMORY DEVICES

CROSS-REFERENCE TO RELATED APPLICATION

This application is a continuation of U.S. patent application Ser. No. 16/908,287, filed Jun. 22, 2020, now U.S. Pat. No. 11,417,673 issued Aug. 16, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including stair step structures, and to related memory devices, electronic systems, and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As the memory density has increased, the number of tiers of conductive structures and dielectric materials and associated memory cells of each vertical memory string has increased. Support pillar structures may extend through the stack structure to support the stack structure during various processing acts (e.g., during a so-called "replacement gate" or "gate last" process). The support pillar structures may be filled with various materials (e.g., tungsten) exhibiting a relatively greater tensile stress compared to other materials or structures of the stack structure. As a consequence, and by way of example only, the tensile stress of support pillar structures comprising tungsten may lead to so-called "block bending" wherein the stack structure exhibits asymmetries, leading to complications such as tier shrinkage, over etching or under etching of various regions of the stack structure, contact misalignment (e.g., between access lines and the strings of memory cells), and electrical shorting between various conductive features of the stack structure.

DETAILED DESCRIPTION

Figure 1:
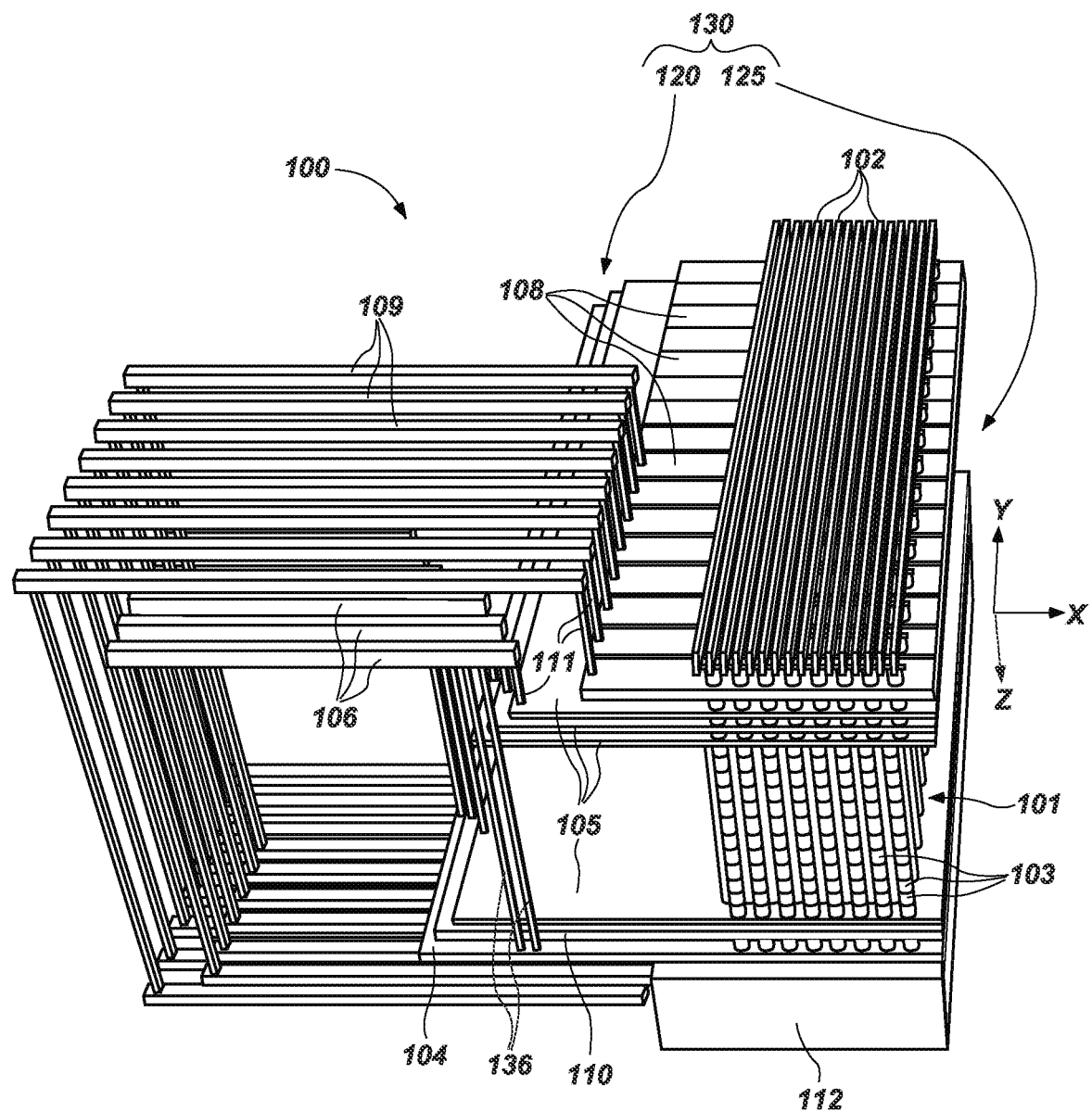
FIG. 1 is a simplified cutaway perspective view of a microelectronic device, according to embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as NAND Flash memory device), apparatus, or electronic system, or a complete microelectronic device, apparatus, or electronic system including self-aligned contact structures having a relatively larger lateral dimension (e.g., area, cross-sectional area) relative to vertical memory strings or pillars associated with the contact structures. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low-pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random-access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

According to embodiments described herein, a microelectronic device comprises a stack structure comprising alternating conductive structures and insulative structures arranged in tiers, each tier comprising a conductive structure and an insulative structure. Strings of memory cells may extend through the stack structure. First support pillar structures vertically extend through the stack structure in a first region and second support pillar structures vertically extend through the stack structure in a second region of the stack structure. The first support pillar structures may be connected to bridge structures within a source structure underlying the stack structure and electrically isolated from the source structure by a dielectric liner material. The bridge structures may couple at least one first support pillar structure to at least another support pillar structure. The bridge structures may comprise a dielectric material and, in some embodiments, at least another material (e.g., polysilicon). A slot structure may be located horizontally between the at least one first support pillar structure and the at least another support pillar structure. The second support pillar structures may comprise an electrically conductive material in electrical communication with the source structure and with underlying circuitry (e.g., conductive routing structures, CMOS structures). Accordingly, the second support pillar structures may comprise a different material composition than the first support pillars structures. Since the first support pillar structures do not comprise the electrically conductive material of the second support pillar structures, the first support pillar structures may not exhibit a tensile stress that causes bending of the stack structure and/or misalignment of various features of the stack structure or microelectronic device. In some embodiments, the first support pillar structure are located in a stair step region of the microelectronic device and the second support pillar structures are located external to the stair step region, such as regions located between neighboring stair step regions.

FIG. 1 is a simplified cutaway perspective view of a microelectronic device (e.g., a semiconductor device, a memory device (e.g., a vertical memory device), such as a 3D NAND Flash memory device), according to embodiments of the disclosure. The microelectronic device 100 includes a microelectronic device structure 130 comprising a stack structure 125 and a stair step structure 120 defining contact regions for connecting access lines 106 to conductive tiers 105 (e.g., conductive layers, conductive plates, etc.). The microelectronic device 100 may include vertical strings 101 of memory cells 103 that are coupled to each other in series. The vertical strings 101 may extend vertically (e.g., in the Z-direction) and orthogonally to conductive lines and tiers 105, such as data lines 102, a source tier 104, the conductive tiers 105, the access lines 106, first select gates 108 (e.g., upper select gates, drain select gates (SGDs)), select lines 109, and a second select gate 110 (e.g., a lower select gate, a source select gate (SGS)).

Vertical conductive contacts 111 may electrically couple components to each other as shown. For example, the select lines 109 may be electrically coupled to the first select gates 108 and the access lines 106 may be electrically coupled to the conductive tiers 105. The microelectronic device 100 may also include a control unit 112 positioned under the memory array, which may include at least one of string driver circuitry, pass gates, circuitry for selecting gates, circuitry for selecting conductive lines (e.g., the data lines 102, the access lines 106, etc.), circuitry for amplifying signals, and circuitry for sensing signals. The control unit 112 may be electrically coupled to the data lines 102, the source tier 104, the access lines 106, the first select gates 108, and the second select gates 110, for example. In some embodiments, the control unit 112 includes CMOS (complementary metal-oxide-semiconductor) circuitry. In such embodiments, the control unit 112 may be characterized as having a "CMOS under Array" ("CuA") configuration.

The first select gates 108 may extend horizontally in a first direction (e.g., the X-direction) and may be coupled to respective first groups of vertical strings 101 of memory cells 103 at a first end (e.g., an upper end) of the vertical strings 101. The second select gate 110 may be formed in a substantially planar configuration and may be coupled to the vertical strings 101 at a second, opposite end (e.g., a lower end) of the vertical strings 101 of memory cells 103.

The data lines 102 (e.g., bit lines) may extend horizontally in a second direction (e.g., in the Y-direction) that is at an angle (e.g., perpendicular) to the first direction in which the first select gates 108 extend. The data lines 102 may be coupled to respective second groups of the vertical strings 101 at the first end (e.g., the upper end) of the vertical strings 101. A first group of vertical strings 101 coupled to a respective first select gate 108 may share a particular vertical string 101 with a second group of vertical strings 101 coupled to a respective data line 102. Thus, a particular vertical string 101 may be selected at an intersection of a particular first select gate 108 and a particular data line 102.

The conductive tiers 105 (e.g., word line plates) may extend in respective horizontal planes. The conductive tiers 105 may be stacked vertically, such that each conductive tier 105 is coupled to all of the vertical strings 101 of memory cells 103, and the vertical strings 101 of the memory cells 103 extend vertically through the stack of conductive tiers 105. The conductive tiers 105 may be coupled to or may form control gates of the memory cells 103 to which the conductive tiers 105 are coupled. Each conductive tier 105 may be coupled to one memory cell 103 of a particular vertical string 101 of memory cells 103.

The first select gates 108 and the second select gates 110 may operate to select a particular vertical string 101 of the memory cells 103 between a particular data line 102 and the source tier 104. Thus, a particular memory cell 103 may be selected and electrically coupled to a data line 102 by operation of (e.g., by selecting) the appropriate first select gate 108, second select gate 110, and conductive tier 105 that are coupled to the particular memory cell 103.

The stair step structure 120 may be configured to provide electrical connection between the access lines 106 and the tiers 105 through the vertical conductive contacts 111. In other words, a particular level of the tiers 105 may be selected via an access line 106 in electrical communication with a respective vertical conductive contact 111 in electrical communication with the particular tier 105.

Support pillar structures 136 may vertically extend (e.g., in the Z-direction) through the stair step structure 120 to the source tier 104. As will be described herein, the support pillar structures 136 may serve as support structures for the formation of the conductive tiers 105 of the stair step structure 120 using a so called "replace gate" or "gate last" processing acts. At least some of the support pillar structures 136 may include a bridge structure extending horizontally therebetween that may facilitate formation of support pillar structures 136 coupled to each other through the bridge structure. At least some other support pillar structures of the support pillar structures may not be coupled to a bridge structure and may include a different material composition than the support pillar structures coupled to each other by the bridge structures extending horizontally therebetween. In some embodiments, the support pillar structures 136 coupled by a bridge structure are located within the stack structures 125.

Figure 2:
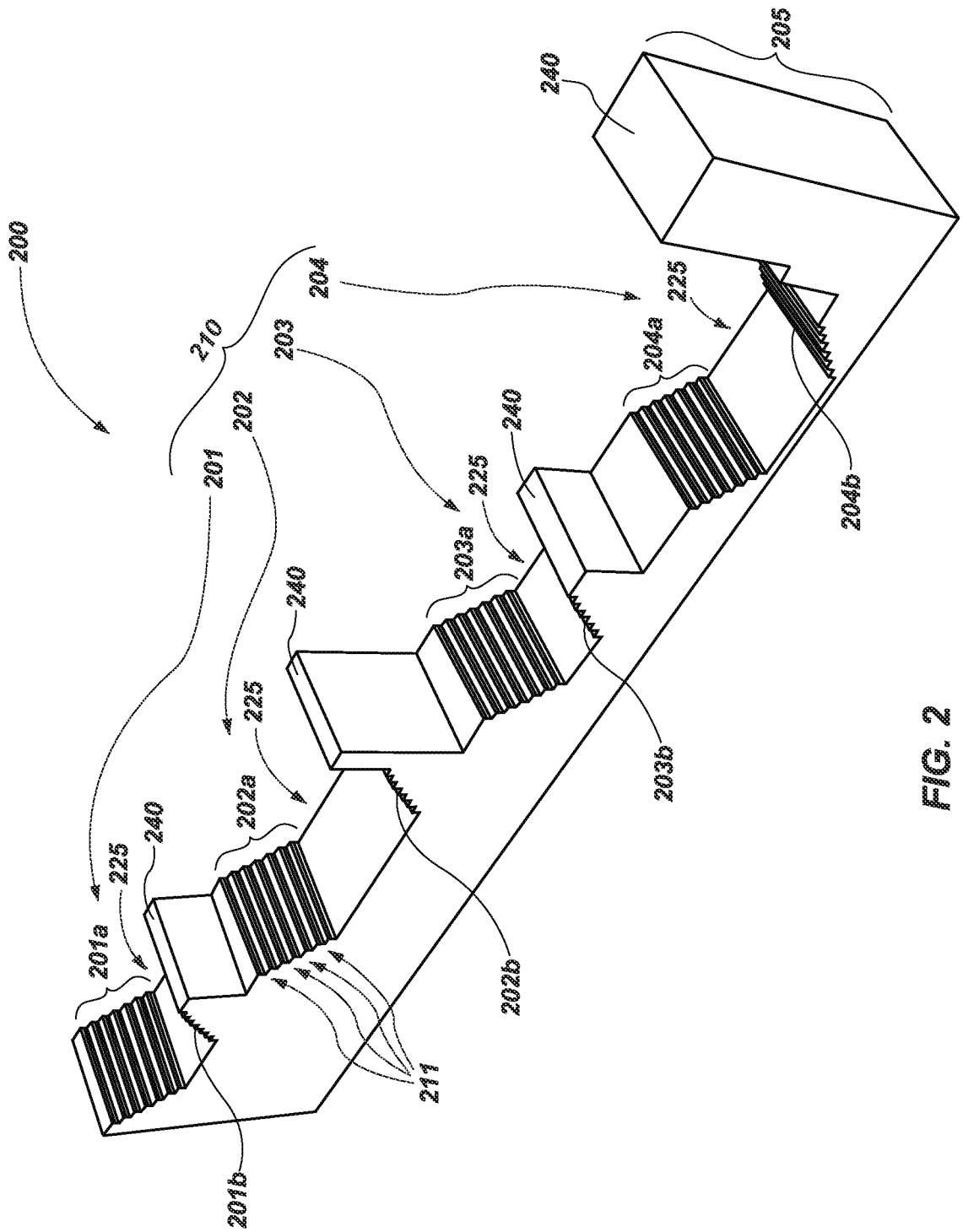
FIG. 2 is a simplified perspective view of a microelectronic device structure of the microelectronic device shown in FIG. 1, in accordance with embodiments of the disclosure.

FIG. 2 is a simplified perspective view of a microelectronic device structure 200, in accordance with embodiments of the disclosure. The microelectronic device structure 200 may, for example, be employed as the microelectronic device structure 130 in the microelectronic device 100 previously described with reference to FIG. 1. As shown in FIG. 2, the microelectronic device structure 200 may include one or more stair step structures 210 (e.g., stair step structures 120 (FIG. 1)). Steps 211 of the stair step structure(s) 210 of the microelectronic device structure 200 may serve as contact regions for different tiers (e.g., conductive tiers 105 (FIG. 1)) of conductive materials of the stack structure 205 (e.g., the stack structure 125 of the microelectronic device structure 130 of the microelectronic device 100 described with reference to FIG. 1). The steps 211 may be located at horizontal ends of conductive structures (e.g., the conductive tiers 105) and insulative structures located between neighboring conductive structures.

The stair step structure(s) 210 may include, for example, a first stair step structure 201a, a second stair step structure 202a, a third stair step structure 203a, and a fourth stair step structure 204a at different elevation (e.g., vertical positions) than one another within the stack structure 205. In addition, the stair step structures 210 may further include another first stair step structure 201b opposing and at the same elevation as the first stair step structure 201a, another second stair step structure 202b opposing and at the same elevation as the another second stair step structure 202b, another third stair step structure 203b opposing and at the same elevation as the another third stair step structure 203b, and another fourth stair step structure 204b opposing and at the same elevation as the another fourth stair step structure 204b. Each of the first stair step structure 201a, the second stair step structure 202a, the third stair step structure 203a, and the fourth stair step structure 204a may individually exhibit a generally negative slope; and each of the another first stair step structure 201b, the another second stair step structure 202b, the another third stair step structure 203b, and the another fourth stair step structure 204b may individually exhibit a generally positive slope. As shown in FIG. 2, the first stair step structure 201a and the another first stair step structure 201b may form a first stadium structure 201 with a valley 225 between the first stair step structure 201a and the another first stair step structure 201b; the second stair step structure 202a and the another second stair step structure 202b may form a second stadium structure 202 with a valley 225 between the second stair step structure 202a and the another second stair step structure 202b; the third stair step structure 203a and the another third stair step structure 203b may form a third stadium structure 203 with a valley 225 between the third stair step structure 203a and the another third stair step structure 203b; and the fourth stair step structure 204a and the another fourth stair step structure 204b may form a fourth stadium structure 204 with a valley 225 between the fourth stair step structure 204a and the another fourth stair step structure 204b.

As described above, an electrically conductive contact (e.g., a vertical conductive contact 111 (FIG. 1)) may be formed to the electrically conductive portion of each tier (e.g., each step 211) of the stack structure 205 of the microelectronic device structure 200.

A region between neighboring stadium structures (e.g., the first stadium structure 201, the second stadium structure 202, the third stadium structure 203, and the fourth stadium structure 204) may comprise an elevated region 240, which may also be referred to as a so-called staircase or stair step "crest region." As will be described herein, support pillar structures (e.g., support pillar structures 136 (FIG. 1)) may be located within the elevated regions 240 and other support pillar structures may be located within the stair step structures (e.g., the first stair step structure 201a, the another first stair step structure 201b, the second stair step structure 202a, the another second stair step structure 202b, the third stair step structure 203a, the another third stair step structure 203b, the fourth stair step structure 204a, the another fourth stair step structure 204b). In some embodiments, the support pillar structures in the stair step structures may be coupled to at least another support pillar structure through a bridge structure. Support pillar structures within the elevated regions 240 may not be coupled to at least another support pillar structure. In some embodiments, the support pillar structures located in the elevated regions 240 (and not coupled to a bridge structure) and are electrically coupled to an underlying source structure and underlying circuitry of the microelectronic device (e.g., the control unit 112 (FIG. 1)).

As will be understood by those of ordinary skill in the art, although the microelectronic device structure 130 (FIG. 1) and the microelectronic device structure 200 (FIG. 2) have been described as having particular structures, the disclosure is not so limited and the microelectronic device structures 130, 200 may have different geometric configurations and orientations.

Figure 3C:
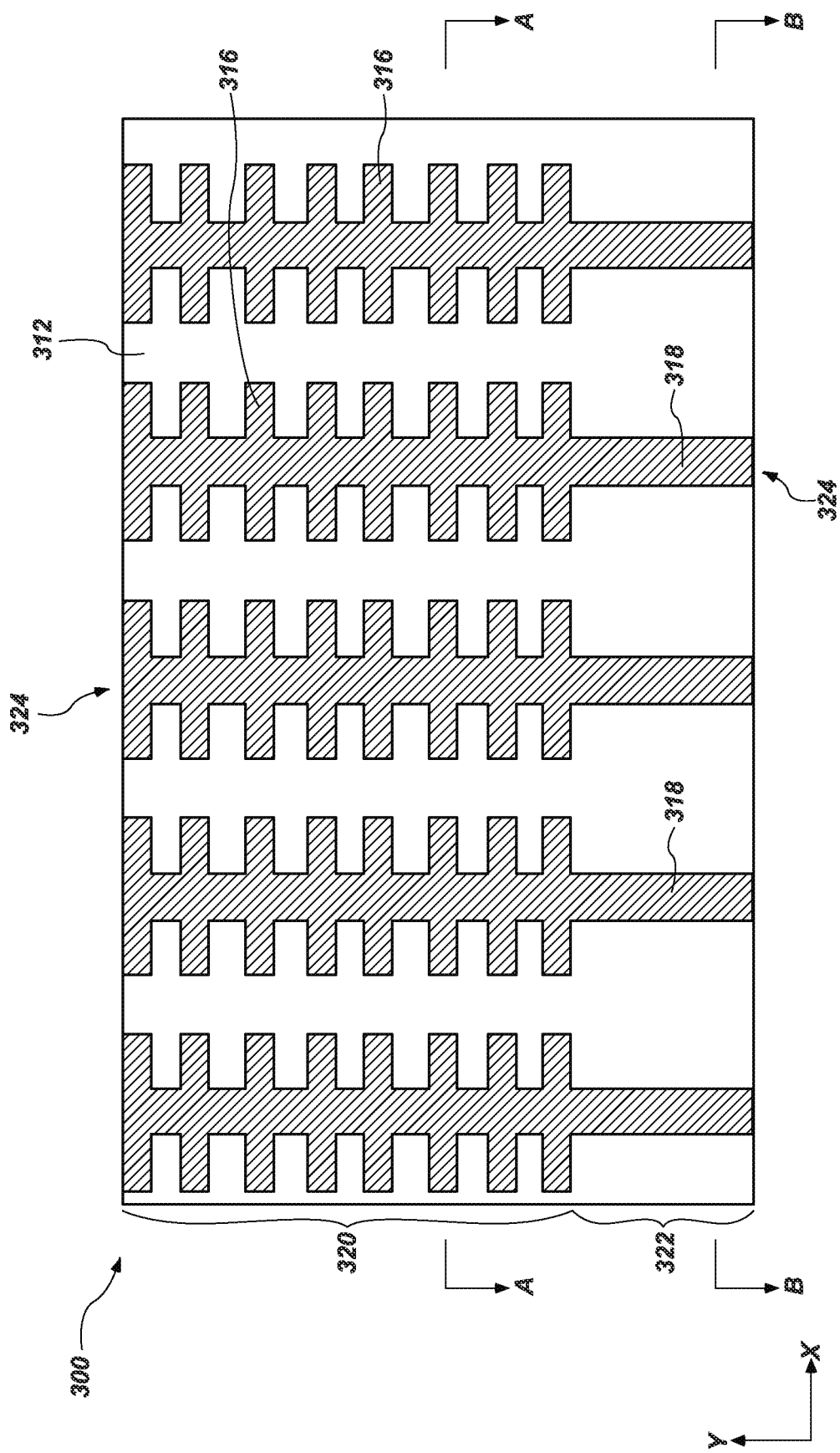
FIG. 3A through FIG. 3T are simplified cross-sectional views (FIG. 3A, FIG. 3B, FIG. 3D, FIG. 3E, FIG. 3G through FIG. 3R, FIG. 3T) and planar views (FIG. 3C, FIG. 3F, FIG. 3S) illustrating a method of forming a microelectronic device structure, in accordance with embodiments of the disclosure.
Figure 3D:
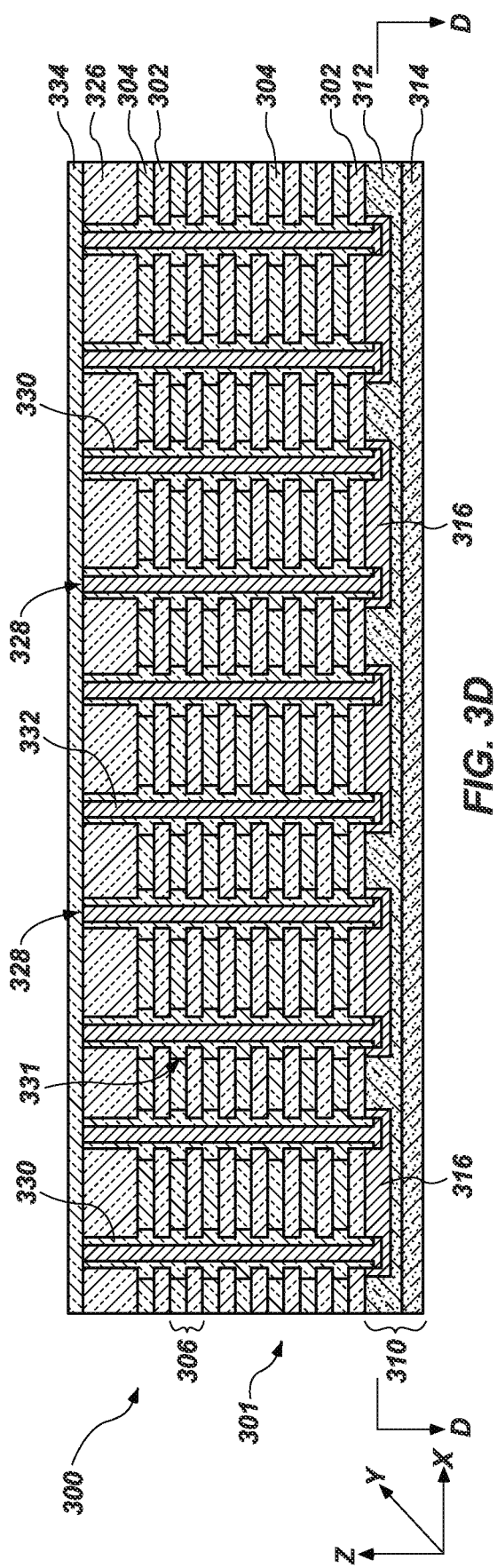
Figure 3E:
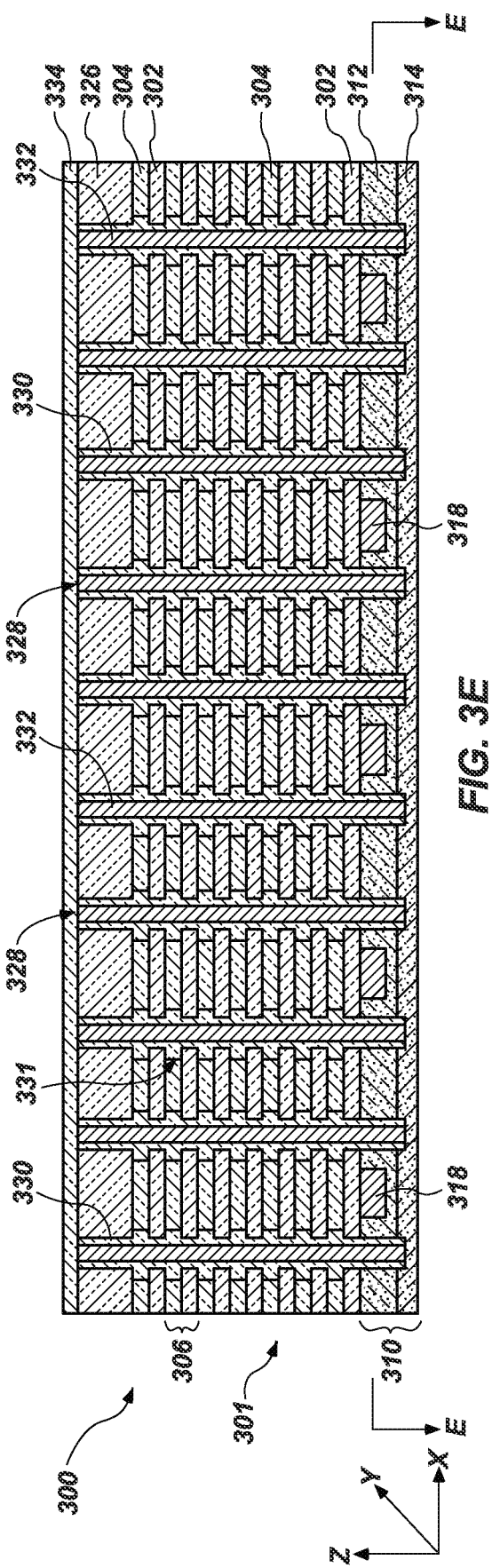
Figure 3F:
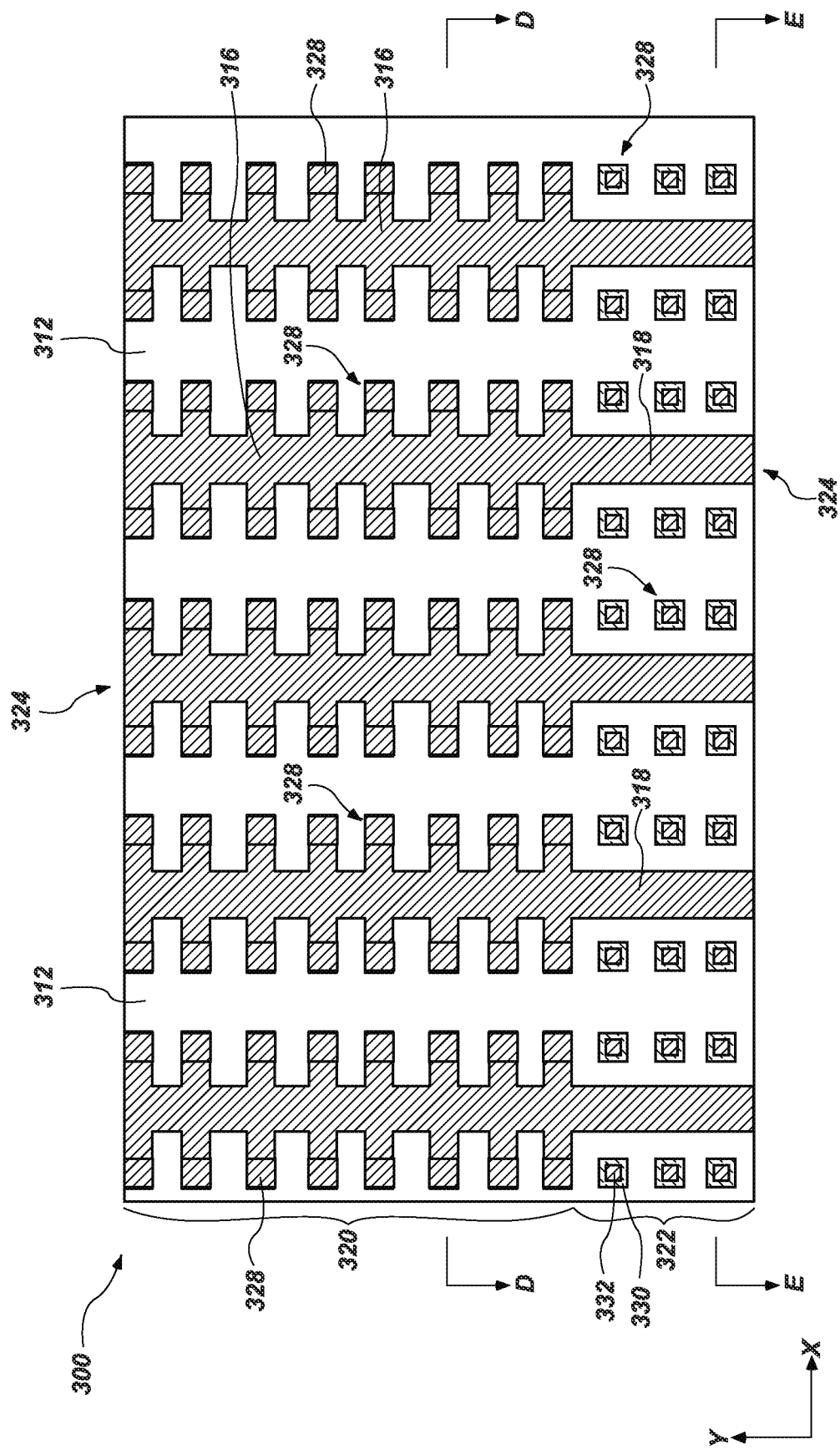
Figure 3O:
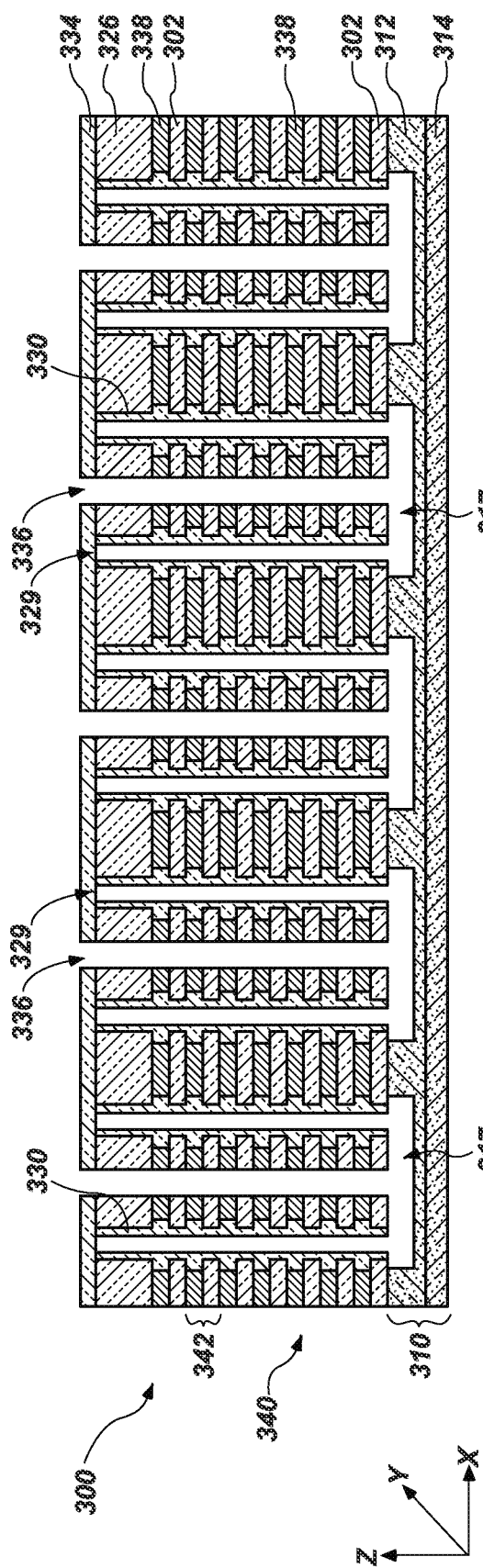
Figure 3P:
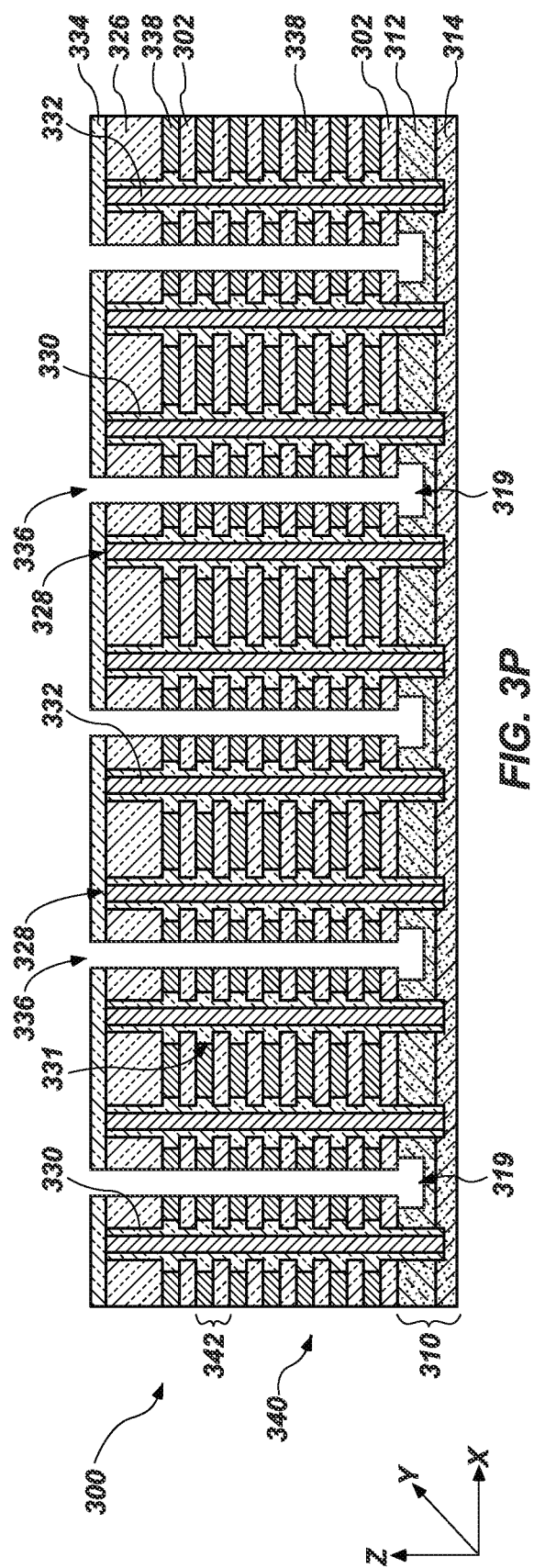
Figure 3Q:
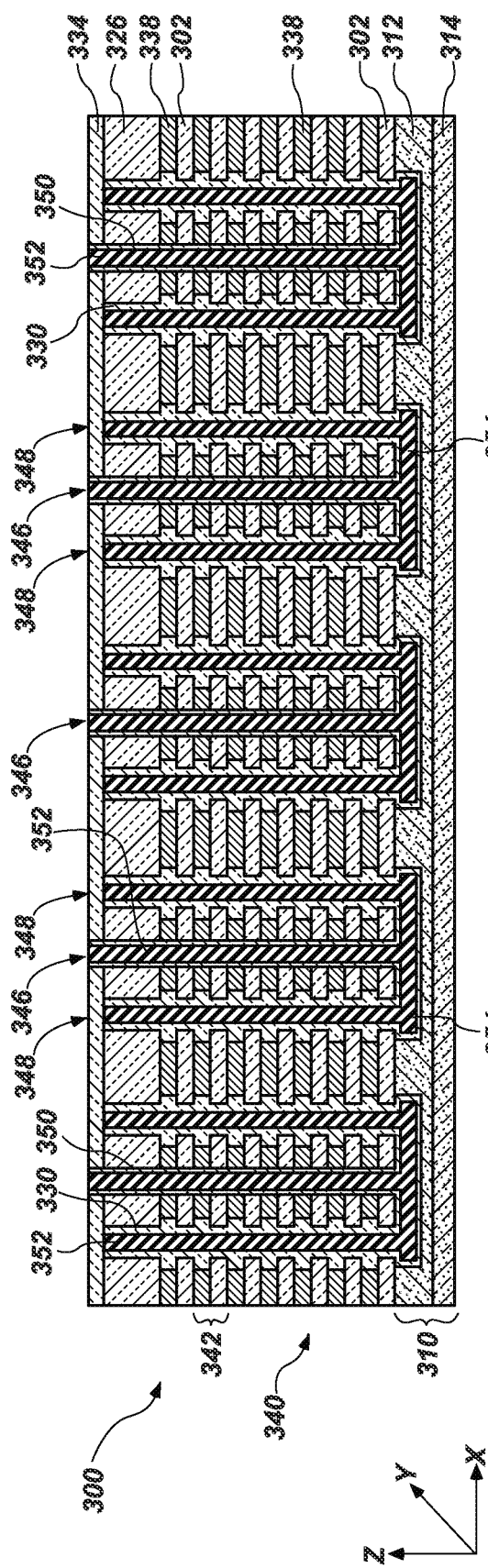
Figure 3R:
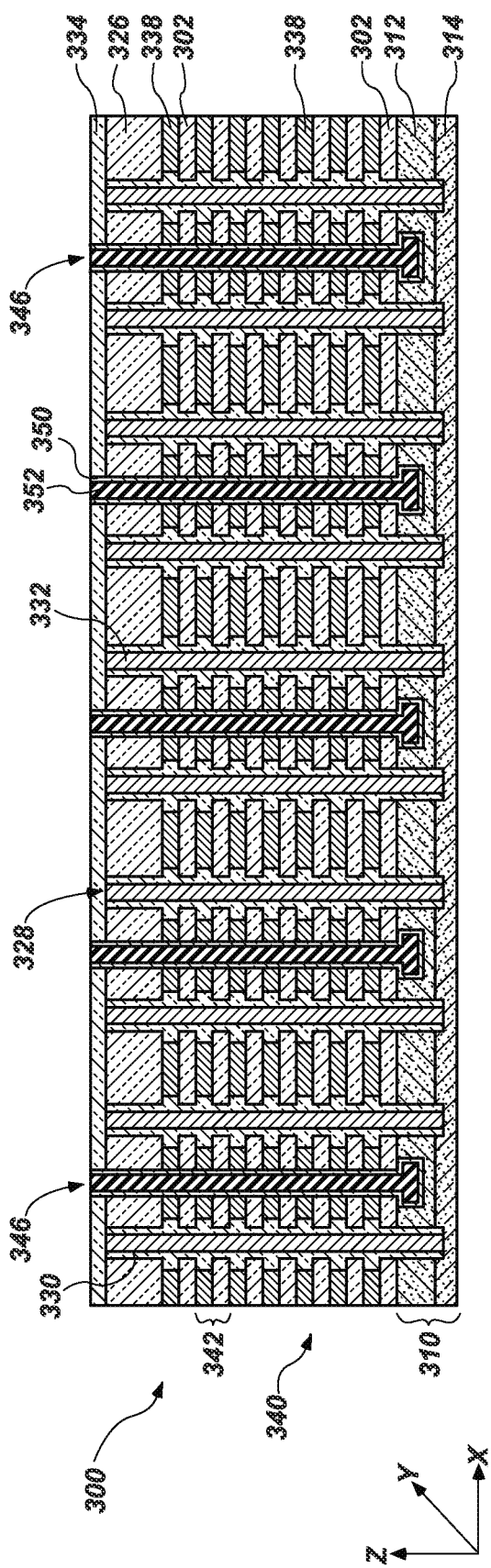
Figure 3S:
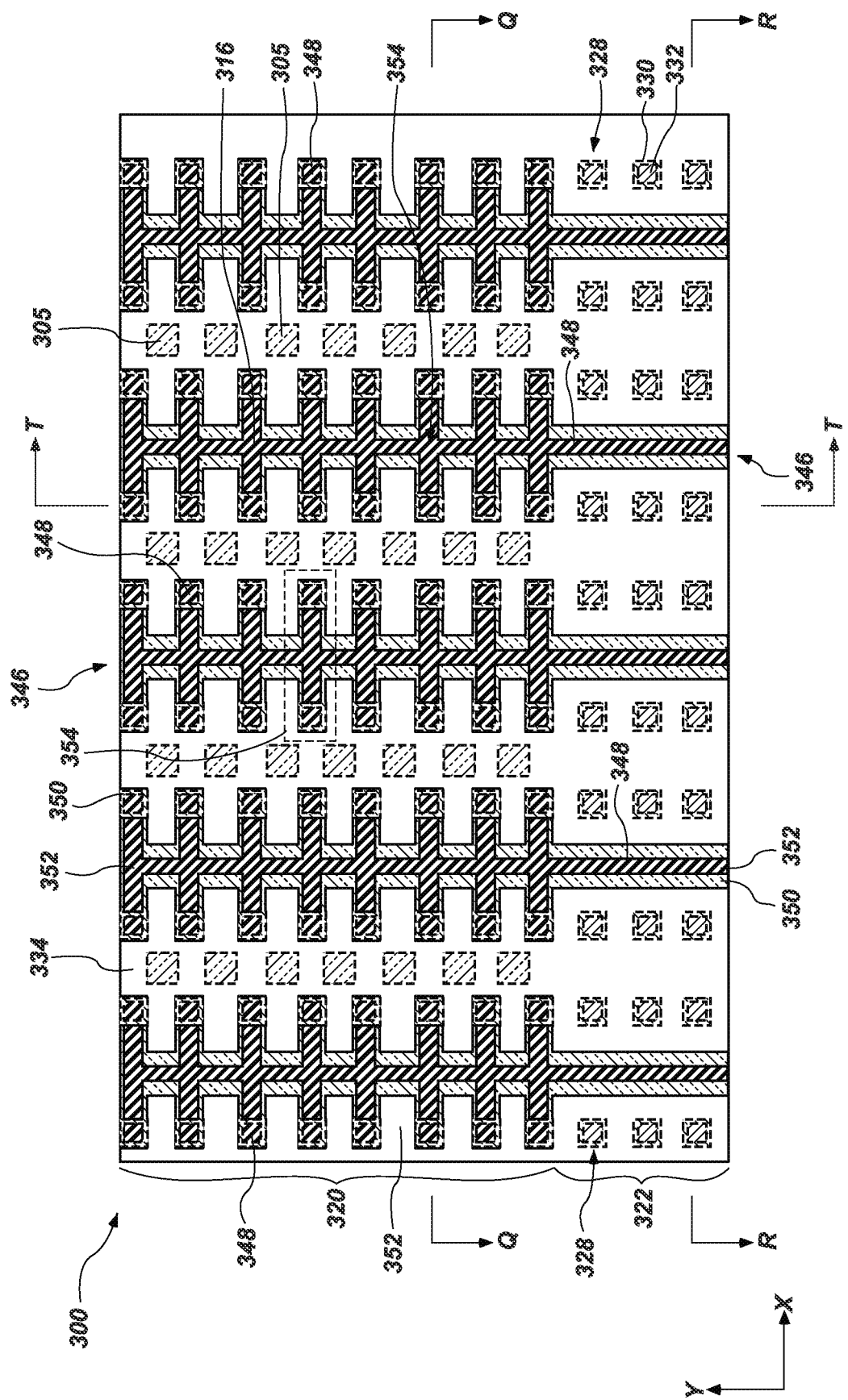

FIG. 3A through FIG. 3S are partial cross-sectional views illustrating a method of forming a microelectronic device structure 300, in accordance with embodiments of the disclosure. The microelectronic device structure 300 may comprise, for example, the microelectronic device structures 130, 200 previously described with reference to FIG. 1 and FIG. 2. One of ordinary skill in the art will appreciate that only a portion of the microelectronic device structure 300 is depicted in FIG. 3A through FIG. 3S. Accordingly, processing similar to or different than that illustrated in FIG. 3A through FIG. 3S may be performed on other regions of the microelectronic device structure 300 (e.g., to form the microelectronic device 100 or microelectronic device structure 130, 200 previously described with reference to FIG. 1 and FIG. 2), as desired.

FIG. 3A and FIG. 3B are simplified cross-sectional views of the microelectronic device structure 300. FIG. 3C is a simplified planar view of the microelectronic device structure 300. FIG. 3A is a cross-sectional view of the microelectronic device structure 300 taken through section line A-A of FIG. 3C and FIG. 3B is a cross-sectional view of the microelectronic device structure 300 taken through section line B-B of FIG. 3C.

With reference to FIG. 3A and FIG. 3B, the microelectronic device structure 300 may include a stack structure 301 including a vertically alternating (e.g., in the Z-direction) sequence of insulative structures 302 and other insulative structures 304 arranged in tiers 306. The insulative structures 302 of the stack structure 301 may also be referred to herein as "insulative materials" and the other insulative structures 304 of the stack structure 101 may also be referred to herein as "other insulative materials." Each of the tiers 306 of the stack structure 301 may include at least one (1) of the insulative structures 302 vertically-neighboring at least one of the other insulative structures 304. The stack structure 301 may include a desired quantity of the tiers 306. For example, the stack structure 301 may include greater than or equal to ten (10) of the tiers 306, greater than or equal to twenty-five (25) of the tiers 306, greater than or equal to fifty (50) of the tiers 306, greater than or equal to one hundred (100) of the tiers 306, greater than or equal to one hundred and fifty (150) of the tiers 306, or greater than or equal to two hundred (200) of the tiers 306 of the conductive stack structures 301 and the insulative structures 302.

The levels of the insulative structures 302 may be formed of and include, for example, at least one dielectric material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$)). In some embodiments, the insulative structures 302 are formed of and include silicon dioxide.

The levels of the other insulative structures 304 may be formed of and include an insulative material that is different than, and exhibits an etch selectivity with respect to, the insulative structures 302. In some embodiments, the other insulative structures 302 are formed of and include a nitride material (e.g., silicon nitride ($Si_3N_4$)) or an oxynitride material (e.g., silicon oxynitride). In some embodiments, the other insulative structures 304 comprise silicon nitride.

The stack structure 301 may be formed over a source structure 310 (e.g., a source plate). The source structure 310 may include, for example, a first source material 312 over (e.g., on) a second source material 314. The first source material 312 may be formed of and include a semiconductor material doped with one of P-type conductivity materials (e.g., polysilicon doped with at least one P-type dopant (e.g., boron ions)) or N-type conductivity materials (e.g., polysilicon doped with at least one N-type dopant (e.g., arsenic ions, phosphorous ions, antimony ions)). In some embodiments, the first source material 312 comprises polysilicon. The second source material 314 may comprise, for example, tungsten, such as tungsten silicide ($WSi_x$).

Although FIG. 3A and FIG. 3B have been described and illustrated as including the stack structure 301 having a particular configuration, the disclosure is not so limited. In some embodiments, the stack structure 301 comprises a first deck structure on the source directly over (e.g., on) the source structure 310 and a second deck structure over the first deck structure. The second deck structure may be separated from the first deck structure by at least one dielectric material. In some such embodiments, the stack structure 301 may be referred to as a dual deck structure.

Bridge structures 316 (FIG. 3A) and landing pads 318 (FIG. 3B) may be located within the source structure 310. As will be described herein, each of the bridge structures 316 may be used to facilitate landing of at least two pillar structures (e.g., support pillar structures 328) and a slot between the at least two pillar structures (e.g., a replacement gate slot), and the landing pads 318 may be used to facilitate landing of slots. The bridge structures 316 may have a greater dimension (e.g., a greater horizontal dimension (in the X-direction)) than the landing pads 318. With combined reference to FIG. 3A through FIG. 3C, the bridge structures 316 may be located in a first region 320 of the microelectronic device structure 300 and the landing pads 318 may be located in a second region 322 of the microelectronic device structure 300. In some embodiments, the first region 320 comprises a stair step structure (e.g., stair step structure 120 (FIG. 1), stair step structures 210 (FIG. 2)) and the second region 322 comprises regions external to the stair step structure (e.g., the elevated regions 240 (FIG. 2)).

A dielectric material 326 may overlie the stack structure 301 and may be formed of and include an electrically insulative material such as, for example, (e.g., one or more of $SiO_x$, phosphosilicate glass (PSG), borosilicate glass (BSG), borophosphosilicate glass (BPSG), fluorosilicate glass (FSG), $AlO_x$, $HfO_x$, $NbO_x$, $TiO_x$, $ZrO_x$, $TaO_x$, and $MgO_x$, at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric material 326 comprises silicon dioxide.

With reference to FIG. 3C, the bridge structures 316 and the landing pads 318 may be coupled to each other as lines 324 extending in, for example, the Y-direction. The bridge structures 316, the landing pads 318, and the lines 324 may be formed of and include, an electrically conductive material. In some embodiments, the bridge structures 316, the landing pads 318, and the lines 324 comprise the same material composition. In some embodiments, the bridge structures 316, the landing pads 318, and the lines 324 comprise tungsten.

Referring to FIG. 3D through FIG. 3F, support pillar structures 328 may be formed through the dielectric material 326 and the stack structure 301. FIG. 3D illustrates a cross-section of the microelectronic device structure 300 taken through section line D-D of FIG. 3F and FIG. 3E illustrates a cross-section of the microelectronic device structure 300 taken through section line E-E of FIG. 3F. FIG. 3F is a planar cross-sectional view of the microelectronic device structure taken through section line D-D of FIG. 3D and section line E-E of FIG. 3E. With reference to FIG. 3D and FIG. 3E, the support pillar structures 328 may include a liner material (dielectric liner material) 330 and an electrically conductive material 332 horizontally neighboring to the liner material 330. Since the support pillar structures 328 include an electrically conductive material 332, the support pillar structures 328 may be referred to herein as "conductive support pillar structures."

With reference to FIG. 3D and FIG. 3F, the support pillar structures 328 in the first region 320 may contact (e.g., land on, land within, terminate on, terminate within) the bridge structures 316. The bridge structures 316 may, in some embodiments, horizontally extend between horizontally neighboring support pillar structures 328. In other words, the bridge structures 316 may couple two support pillar structures 328 to each other. However, the disclosure is not so limited and in other embodiments, the bridge structures 316 may couple more than two (e.g., three, four, five, six) of the support pillar structures 328 in the first region 320 to each other.

Referring to FIG. 3E and FIG. 3F, the support pillar structures 328 in the second region 322 may contact (e.g., land on, land within, terminate on, terminate within) the source structure 310, such as the second source material 314. In some such embodiments, the support pillar structures 328 in the second region 322 may extend through the first source material 312 and may be in electrical communication with the source structure 310 (e.g., the second source material 314). The support pillar structures 328 in the second region 322 may be located between neighboring (e.g., horizontally neighboring) landing pads 318 and may not contact the landing pads 318. Accordingly, in some embodiments the support pillar structures 328 within the first region 320 may contact the bridge structures 316 while the support pillar structures 328 within the second region 322 contact the source structure 310 (e.g., the second source material 314).

The liner material 330 may be formed of and include a dielectric material, such as one or more of the materials described above with reference to the dielectric material 326. In some embodiments, the liner material 330 comprises an oxide material, such as silicon dioxide. The electrically conductive material 332 may be formed of and include, for example, tungsten. In some embodiments, the electrically conductive material 332 comprises the same material composition as the bridge structures 316 and the landing pads 318.

The support pillar structures 328 may be formed by, for example, forming openings through the dielectric material 326 and the stack structure 301. By way of non-limiting example, the openings may be formed by dry etching, such as reactive ion etching (RIE). In some embodiments, the openings are formed by sequentially exposing the insulative structures 302 and the other insulative structures 304 of the stack structure 301 to various etchants. For example, the insulative structures 302 may be removed by exposure to one or more hydrofluorocarbon gases such as one or more of octylfluorocyclobutane ($C_4F_8$), hexafluoro-1,3-butane ($C_4F_6$), carbon tetrafluoride ($CF_4$), difluoromethane ($CH_2F_2$), fluoromethane ($CH_3F$), fluoroform ($CHF_3$), one or more of sulfur hexafluoride ($SF_6$), and nitrogen trifluoride ($NF_3$); and the other insulative structures 304 may be removed by exposure to one or more of tetrafluoropropene ($C_3H_2F_4$), fluoropropene ($C_3H_5F$), hydrogen ($H_2$), fluorine ($F_2$), carbon tetrafluoride ($CF_4$), fluoromethane ($CH_3F$), or another material. However, the disclosure is not so limited and the openings may be formed by other methods and/or with different etch gases.

After forming the openings, a portion of the other insulative structures 304 may be removed to form recesses that are subsequently filled with the dielectric liner material 330 to form laterally extending portions 331 of the dielectric liner material 330. In some embodiments, the other insulative structures 304 may be exposed to one or more etchants to selectively remove a portion of each of the other insulative structures 304 without substantially removing the insulative structures 302. By way of non-limiting example, the other insulative structures 304 may be exposed to one or more of phosphoric acid, hydrochloric acid, sulfuric acid, hydrofluoric acid, nitric acid, ammonium fluoride, or another material. The liner material 330 may be formed after removing the portion of each of the other insulative structures 304.

After forming the support pillar structures 328, a dielectric material 334 may be formed over the microelectronic device structure 300. The dielectric material 334 may also be referred to as a "mask material" or a "cap material." The dielectric material 334 may comprise one or more of the materials described above with reference to the dielectric material 326. In some embodiments, the dielectric material 334 comprises silicon dioxide. In some embodiments, the dielectric material 334 comprises the same material composition as the dielectric material 326.

FIG. 3G illustrates the same cross-sectional view of FIG. 3D and FIG. 3H illustrates the same cross-sectional view of FIG. 3E. Referring to FIG. 3G and FIG. 3H, openings 336 (which may also be referred to herein as "replacement gate slot openings") may be formed through the stack structure 301 and between neighboring (e.g., horizontally neighboring) ones of the support pillar structures 328.

The openings 336 may extend through the dielectric material 334, the dielectric material 326, and the stack structure 301. In the first region 320, the openings 336 may extend to (e.g., land on, land within, terminate on, terminate within) bridge structures 316 and in the second region 322, the openings 336 may extend to (e.g., land on, land within, terminate on, terminate within) the landing pads 318. The openings 336 may be formed as described above with reference to forming the openings for forming the support pillar structures 328.

FIG. 3I illustrates the same cross-sectional view of the microelectronic device structure 300 as FIG. 3G and FIG. 3J illustrates the same cross-sectional view of the microelectronic device structure 300 as FIG. 3H. With reference to FIG. 3I and FIG. 3J, the bridge structures 316 (FIG. 3G), the landing pads 318 (FIG. 3H), and the lines 324 (FIG. 3F) may be removed (e.g., exhumed) through the openings 336 to form recesses 317 at locations corresponding to the bridge structures 316 and recesses 319 at locations corresponding to the landing pads 318. In some embodiments, the electrically conductive material 332 of the support pillar structures 328 may be removed in the first region 320 while the electrically conductive material 332 of the support pillar structures 328 in the second region 322 is not removed. For example, since the electrically conductive material 332 of the support pillar structures 328 within the first region 320 are in electrical communication with the bridge structures 316 (e.g., since the bridge structures 316 span between horizontally neighboring support pillar structures 328 and physically contact the electrically conductive materials 332 of such support pillar structures 328) the electrically conductive material 332 of the support pillar structures 328 may be removed concurrently with removal of the bridge structures 316 in the first region 320. Since the electrically conductive material 332 of the support pillar structures 328 of the second region 322 are isolated from each other and do not include an intervening bridge structure 316, the electrically conductive materials 332 of the support pillar structures 328 in the second region 322 may not be removed during removal of the electrically conductive materials 332 of the support pillar structures 328 in the first region 320. Accordingly, the electrically conductive materials 332 of the support pillar structures 328 of the second region 322 may not be exposed during removal of the landing pads 318 in the second region 322.

The liner material 330 may remain at locations corresponding to the support pillar structures 328 in the first region 320 after removal of the electrically conductive material 332. Removal of the electrically conductive material 332 from the support pillar structures 328 in the first region 320 may form support structures 329 comprising the liner material 330 (e.g., only the liner material 330).

The bridge structures 316 (FIG. 3G), the landing pads 318 (FIG. 3H), and the lines 324 (FIG. 3F) may be removed by, for example, exposing the bridge structures 316, the landing pads 318, and the lines 324 to a wet etchant through the openings 336. The wet etchant may include, for example, hydrofluoric acid, nitric acid, ammonium hydroxide (NH$_4$OH), hydrogen peroxide (H$_2$O$_2$), a mixture of ammonium hydroxide and hydrogen peroxide, a mixture of nitric acid and hydrochloric acid (also referred to as aqua regia) hydrochloric acid, or another material.

FIG. 3K illustrates the same cross-sectional view of the microelectronic device structure 300 as FIG. 3I and FIG. 3L illustrates the same cross-sectional view of the microelectronic device structure 300 as FIG. 3J. Referring to FIG. 3K and FIG. 3L, the other insulative structures 304 (FIG. 3I, FIG. 3J) may be removed from the stack structure 301. In the first region 320 (FIG. 3F), the liner material 330 of the support structures 329 may support the insulative structures 302 from collapsing during and after removal of the other insulative structures 304. In addition, the laterally extending portions 331 of the liner material 330 may further support the insulative structures 302 from collapsing after removal of the other insulative structures 304. With reference to FIG. 3L, the support pillar structures 328 in the second region 322 (FIG. 3F) may include the liner material 330 and the electrically conductive material 332 which may support the insulative structures 302 from collapsing during and after removal of the other insulative structures 304.

The other insulative structures 304 may be removed by exposing the other insulative structures 304 to an etching composition through the openings 336. The etching composition may include one or more of phosphoric acid, hydrochloric acid, sulfuric acid, hydrofluoric acid, nitric acid, ammonium fluoride, or another material. In some embodiments, the etching composition comprises phosphoric acid. In some embodiments, the other insulative structures 304 comprise silicon nitride.

FIG. 3M illustrates the same cross-sectional view of the microelectronic device structure 300 as FIG. 3K and FIG. 3N illustrates the same cross-sectional view of the microelectronic device structure 300 as FIG. 3L. With reference to FIG. 3M and FIG. 3N, conductive structures 338 (e.g., word lines, word line plates) may be formed between neighboring (e.g., vertically neighboring) insulative structures 302 at locations corresponding to the locations of the other insulative structures 304 (FIG. 3K, FIG. 3L) to form a stack structure 340 comprising tiers 342 of alternating levels of the insulative structures 302 and the conductive structures 338. In some embodiments, at least one lower conductive structure 338 may be employed as at least one lower select gate (e.g., at least one source side select gate (SGS)) of the microelectronic device structure 300. In addition, in some embodiments, upper conductive structure(s) 338 may be employed as upper select gate(s) (e.g., drain side select gates (SGSs)) of the microelectronic device structure 300.

The conductive structures 338 may be formed of and include an electrically conducive material, such as at least one electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RUO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive structures 338 comprise tungsten.

In some embodiments, the conductive structures 338 may include one or more liner materials (e.g., a conductive liner material) around the conductive structures 338, such as between the conductive structures 338 and the insulative structures 302. The liner material may comprise, for example, a seed material from which the conductive structures 338 may be formed. The liner material may be formed of and include, for example, a metal (e.g., titanium, tantalum), a metal nitride (e.g., tungsten nitride, titanium nitride, tantalum nitride), aluminum oxide, or another material. In some embodiments, the liner material comprises titanium nitride. In some embodiments, the liner material further includes aluminum oxide. In some embodiments, the conductive structures 338 include aluminum oxide directly adjacent the insulative structures 302, titanium nitride directly adjacent the aluminum oxide, and tungsten directly adjacent the titanium nitride. For clarity and ease of understanding the description, the one or more liner materials are not illustrated in FIG. 3M and FIG. 3N, but it will be understood that the liner material may be disposed around the conductive structures 338.

With continued reference to FIG. 3M and FIG. 3N, during formation of the conductive structures 338, a conductive material 344 may be formed within the openings 336. The conductive material 344 may be formed at the same time as formation of the conductive structures 338. The conductive material 344 may comprise the same material composition as the conductive structures 338. For example, in some embodiments, the conductive material 344 comprises aluminum oxide, titanium nitride, and tungsten. In addition, the conductive material 344 may be formed within the recesses 317, 319. Accordingly, in the first region 320, the conductive material 344 may extend from a first support structure 329 to a second support structure 329 through the recess 317 and may further extend within the openings 336. Accordingly, with reference to FIG. 3M, the conductive material 344 may be formed within (e.g., on sidewalls) of the support structures 329. In the second region, the conductive material 344 may be formed only within the openings 336.

FIG. 3O and FIG. 3P illustrate the microelectronic device structure 300 after removing the conductive material 344 (FIG. 3M, FIG. 3N) from the sidewalls of the support structures 329 in the first region 320 (FIG. 3F), from the recesses 317, 319 (FIG. 3M, FIG. 3N), and from the sidewalls of the openings 336 in the first region 320 and the second region 322. FIG. 3O illustrates the same cross-section illustrated in FIG. 3M and FIG. 3P illustrates the same cross-section illustrated in FIG. 3N.

Removal of the conductive material 344 may physically and electrically isolate the conductive structures 338 from each other. In some embodiments, the conductive material 344 (FIG. 3M, FIG. 3N) is removed by exposing the conductive material 344 to one or more wet etchants through the openings 336. The wet etchants may include one or more of phosphoric acid, acetic acid, nitric acid, hydrochloric acid, aqua regia, or hydrogen peroxide. However, the disclosure is not so limited and the conductive material 344 may be removed with other etchants.

Referring to FIG. 3Q through FIG. 3S, slot structures 346 may be formed in the first region 320 and the second region 322 at locations corresponding to the openings 336 (FIG. 3O, FIG. 3P) and support pillar structures 348 may be formed in the first region 320 (e.g., only in the first region 320) at locations corresponding to the support structures 329 (FIG. 3O). FIG. 3S is a top planar view of the microelectronic device structure 300 of FIG. 3Q and FIG. 3R. FIG. 3Q is a cross-sectional view of the microelectronic device structure 300 taken through section line Q-Q of FIG. 3S and FIG. 3R is a cross-sectional view of the microelectronic device structure 300 taken through section line R-R of FIG. 3S. For clarity and ease of understanding of the drawings and related description, some vertically lower components (e.g., features, structures, devices) of the microelectronic device structure 300 underlying relatively vertically-higher components of the microelectronic device structure 300 are depicted in FIG. 3S using dashed lines so as to provide a clearer understanding of aspects (e.g., positions, geometric configurations) of the vertically-lower components.

The slot structures 346 may include a liner material 350 and another material 352 laterally neighboring to the liner material 350. The support pillar structures 348 may include the liner material 330 and the another material 352 horizontally neighboring to the liner material 330. In some embodiments, the liner material 350 is continuous with the liner material 330. In other words, the liner material 330 of the support pillar structures 348 in the first region 320 is continuous with the liner material 350 of the support pillar structures 348 in the first region 320.

The slot structures 346 may have a height (in the vertical direction (e.g., in the Z-direction)) that is greater than a height of the support pillar structures 348 and less than a height of the support pillar structures 328. For example, the slot structures 346 may extend through the dielectric material 334 while the support pillar structures 348 do not extend through the dielectric material 334. In the first region 320, the slot structures 346 may be coupled to the support pillar structures 348. In some such embodiments, the another material 352 may be continuous between the slot structures 346 and the support pillar structures 348. In some embodiments, a bridge structure 354 comprising the liner material 350 and the another material 352 may couple the slot structures 346 to neighboring support pillar structures 348 in the first region 320. In some embodiments, two neighboring support pillar structures 348 in the first region 320 are coupled to each other by a bridge structure 354, the slot 346 extending between the neighboring support pillar structures 348.

The support pillar structures 328 in the second region 322 are in electrical communication with the source structure 310 through the electrically conductive material 332. By way of comparison, the support pillar structures 348 in the first region 320 are electrically isolated from the source structure 310 by the liner materials 330, 350. The support pillar structures 328 may have a greater vertical height (e.g., in the Z-direction) than the support pillar structures 348. For example, the support pillar structures 328 may extend farther into the source structure 310 than the support pillar structures 348 in the first region 320.

The liner material 350 may include one or more of the materials described above with reference to the liner material 330. In some embodiments, the liner material 350 comprises silicon dioxide. In some embodiments, the liner material 350 comprises the same material composition as the liner material 330.

The another material 352 may comprise one or more materials exhibiting a tensile stress less than a tensile stress of tungsten. In some embodiments, the another material 352 comprises polysilicon.

With reference to FIG. 3S, after forming the slot structures 346 and the support pillar structures 348, conductive contact pillars 305 may be formed to vertically extend through at least a portion of the microelectronic device structure 300 within the first region 320. The conductive contact pillars 305 may be in electrical communication with individual conductive structures 338 of the stack structure 301.

Figure 3T:
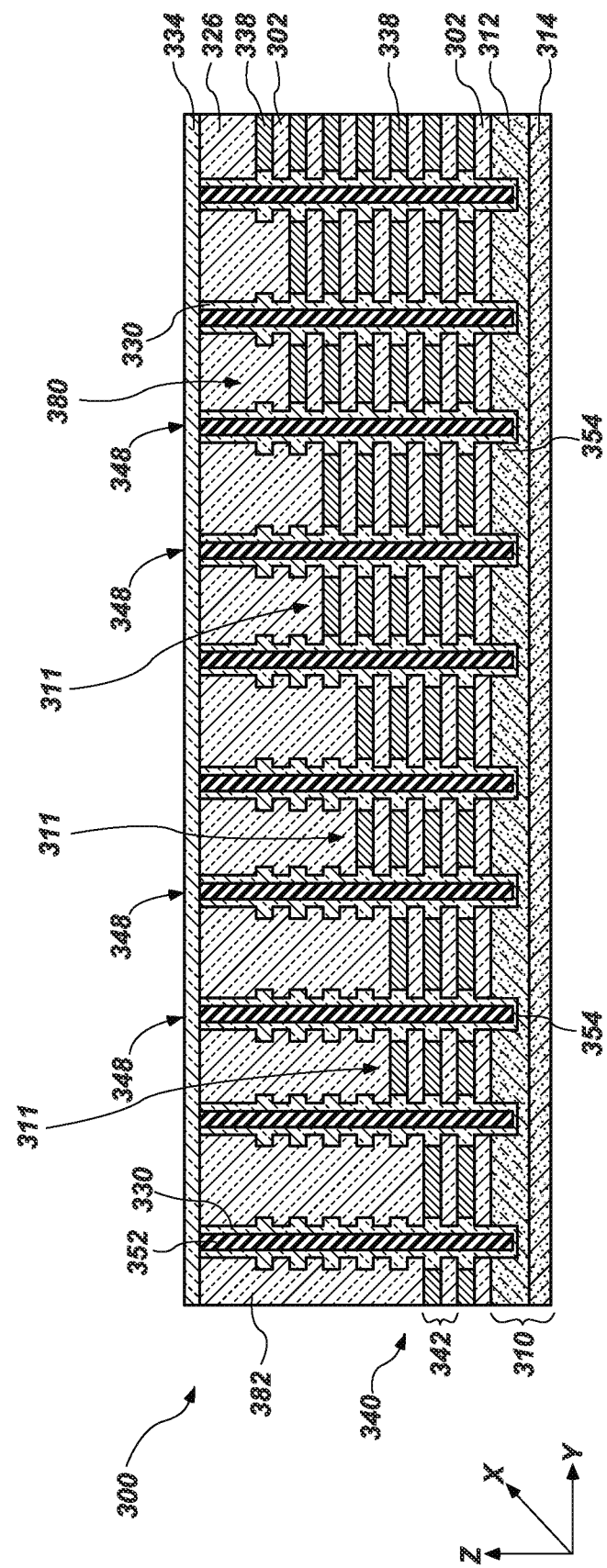

As discussed above with reference to FIG. 3A through FIG. 3S, the first region 320 may comprise a stair step structure. FIG. 3T is a simplified cross-sectional view of the microelectronic device structure 300 comprising a stair step structure 380, in accordance with embodiments of the disclosure. The microelectronic device structure 300 may include steps 311 at horizontal ends of the tiers 342 of the insulative structures 302 and the conductive structures 338. The support pillar structures 348 may extend through a dielectric material 382 overlying the steps 311 of the stair step structure 380 and through the stack structure 340. The dielectric material 382 may comprise one or more of the materials described above with reference to the dielectric material 326. In some embodiments, the dielectric material 382 comprises silicon dioxide. It will be understood that the second region of the microelectronic device structure 300 of FIG. 3T may be substantially similar to the second region 322 described and illustrated above with reference to FIG. 3R and FIG. 3S.

Forming the support pillar structures 348 in the first region 320 to comprise the liner material 330 and the another material 352 may facilitate reduced pillar bending and block bending of the microelectronic device structure 300 compared to conventional microelectronic devices formed with support pillars comprising tungsten or other high tensile stress materials. In addition, since the support pillar structures 328 within the second region 322 include the electrically conductive material 332 rather than the another material 352, the support pillar structures 328 may be electrically coupled to one or more regions within, for example, the source structure 310 or under the source structure 310, such as to a control unit (e.g., the control unit 112 (FIG. 1)) which may be characterized as having a "CMOS under Array" ("CuA") configuration. For example, the support pillar structures 328 may be electrically coupled to conductive interconnect structures that are, in turn, electrically coupled to conductive routing structures. The conductive routing structures, in turn, may be electrically coupled to additional structures and/or devices (e.g., back end of the line (BEOL) devices; control logic devices, such as CMOS devices or string drive circuitry) vertically underlying the microelectronic device structure 300.

Accordingly, the support pillar structures 348 in the first region 320 may be formed to comprise a different material composition (e.g., the another material 352) than the support pillar structures 328 (e.g., the electrically conductive material 332) in the second region 322 without using a separate masking material and separate processing acts to form the support pillar structures 348 in the first region 320 and the support pillar structures 328 in the second region 322. Rather, the support pillar structures 348 and the support pillar structures 328 may be formed simultaneously, as described above. In addition, forming the support pillar structures 348 by forming support pillar structures 328 and landing them on the bridge structures 316 may improve reliability of the microelectronic device structure 300 and substantially prevent over etching of the source structure 310 within the first region 320 and undesirable etching of underlying circuitry and routing materials. Forming the support pillar structures 348 to comprise a material having a relatively lower tensile stress than the electrically conductive material 332 may facilitate improved fabrication of the microelectronic device structure 300. By way of comparison, conventional microelectronic device structures including high tensile stress materials in support pillar structures may exhibit tier shrinkage and block bending. However, the tier shrinkage and block bending may lead to non-planar surfaces during fabrication of the microelectronic device structures. Undesired materials (e.g., polysilicon) may deposit on the non-planar surfaces during subsequent processing acts (e.g., such as during formation of contacts between access lines and memory strings extending through the stack structure). The undesired deposition of such materials may lead to electrical shorting between conductive features or other failure of the microelectronic device structure.

In some embodiments, forming the support pillar structures 348 with the another material 352 may facilitate improved electrical properties of the microelectronic device structure 300. By way of comparison, conventional microelectronic device structures including tungsten in support pillars may undesirably capacitively couple to word lines (e.g., conductive structures) of the microelectronic device and lead to capacitive breakdown of the microelectronic device structure. Accordingly, forming the support pillar structures 348 with the another material 352 may facilitate an increase in the allowable voltage window for operation of the microelectronic device structure 300.

In some embodiments, the bridge structures 316 (FIG. 3A) may facilitate improved processing of the microelectronic device structure 300. In some embodiments, the bridge structures 316 may be located in a stair step structure (e.g., the stair step structure 120 (FIG. 1), the stair step structure 210 (FIG. 2), the stair step structure 380 (FIG. 3T), which may be covered by an oxide fill material (e.g., the dielectric material 382 (FIG. 3T)). During formation of the support pillar structures 328, the oxide fill material may be etched at a faster rate than the materials of the stack structure 301 (FIG. 3D, FIG. 3E). Accordingly, formation of the support pillar structure 328 (FIG. 3D) in the first region 320 (FIG. 3F), which may include the stair step structure may be prone to over etching relative to formation of the support pillar structures 328 in the second region 322 (FIG. 3F). The bridge structures 316 may act as an etch stop during formation of the support pillar structures 328 in the first region 320.

Accordingly, in at least some embodiments, a microelectronic device comprises a stack structure comprising alternating conductive structures and insulative structures arranged in tiers, the tiers individually comprising one of the conductive structures and one of the insulative structures, first support pillar structures extending through the stack structure within a first region of the microelectronic device, the first support pillar structures electrically isolated from a source structure underlying the stack structure, second support pillar structures extending through the stack structure within a second region of the microelectronic device, the second support pillar structures comprising an electrically conductive material in electrical communication with the source structure, and bridge structures extending between at least some neighboring first support pillar structures of the first support pillar structures.

Accordingly, in at least some embodiments, a memory device comprises a stack structure comprising tiers each comprising at least one conductive structure and at least one insulative structure vertically neighboring the at least one conductive structure, a stair step structure having steps comprising horizontal ends of at least some of the tiers, a source structure underlying the stack structure, first support pillar structures vertically extending through the stair step structure to the source structure, at least one of the first support pillar structures coupled to at least another of the first support pillar structures through a bridge structure within the source structure, and second support pillar structures comprising an electrically conductive material vertically extending through the stack structure and in electrical communication with the source structure.

Accordingly, in some embodiments, a method of forming a microelectronic device structure comprises forming conductive support pillar structures through a first region of a stack structure comprising tiers of alternating insulative structures and other insulative structures arranged in tiers, the conductive support pillar structures contacting a bridge structure within a source structure underlying the stack structure, forming conductive support pillar structures through a second region of the stack structure and in contact with the source structure, forming openings through the stack structure and contacting the bridge structures within the first region and landing pads within the second region, removing, through the openings, the bridge structures, the landing pads, and conductive materials of the conductive support pillar structures of the first region to form support structures comprising a dielectric liner material, at least one support structure of the first region in communication with at least another support structure through a recess, replacing the insulative structures with conductive structures through the openings, and filling the openings within the first region and the second region with a dielectric material and another material and filling the recess of the first region with the another material.

Figure 4:
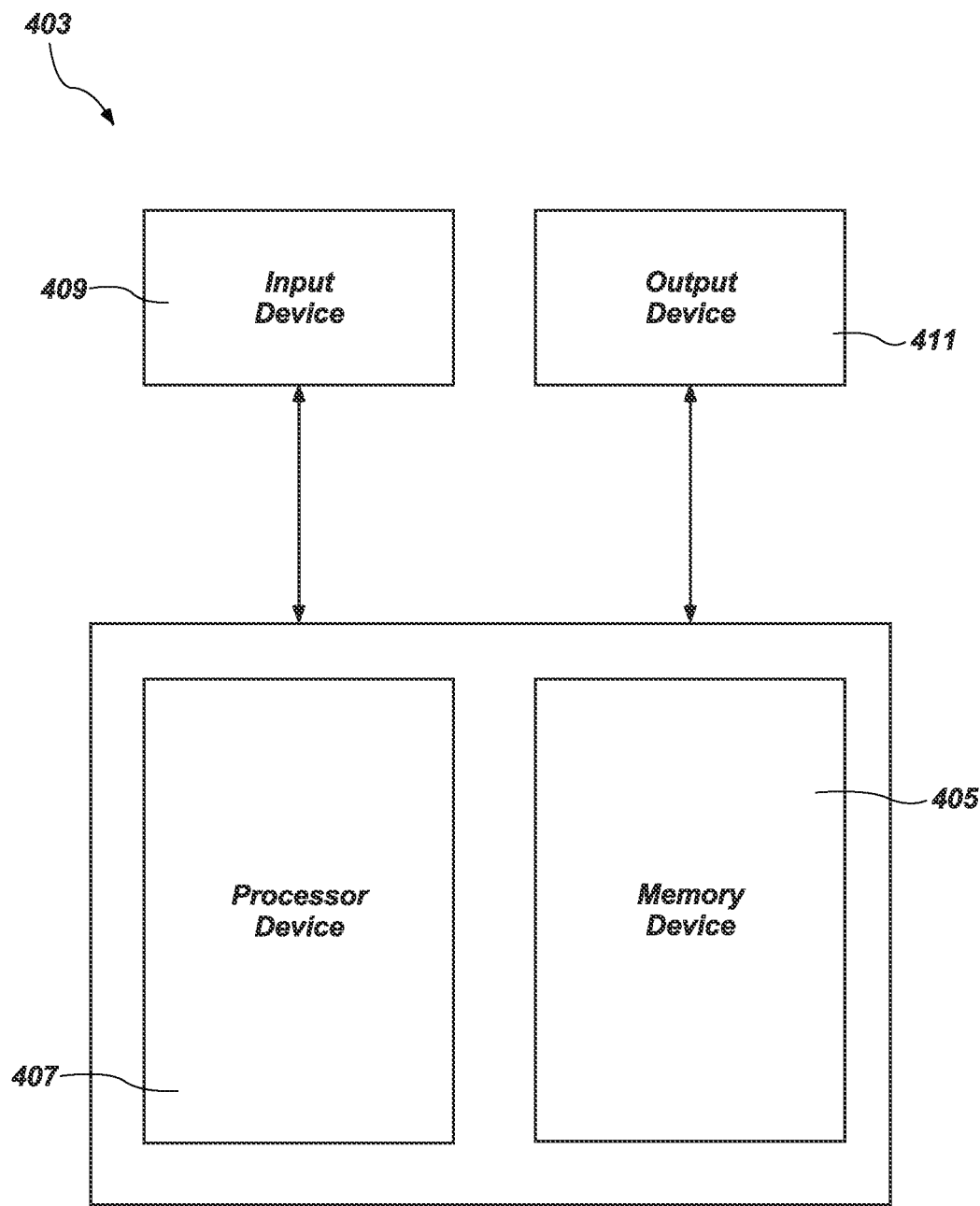
FIG. 4 is a block diagram of an electronic system, in accordance with embodiments of the disclosure.

Microelectronic devices including microelectronic devices (e.g., the microelectronic device 100) and microelectronic device structures (e.g., the microelectronic device structure 130, 200, 300) including the support pillar structures 328 and the support pillar structures 348 may be used in embodiments of electronic systems of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., the microelectronic device structure 130, 200, 300) or a microelectronic device (e.g., the microelectronic device 100) previously described with reference to FIG. 1, FIG. 2, and FIG. 3A through FIG. 3T including the including the support pillar structures 328 and the support pillar structures 348.

The electronic system 403 may further include at least one electronic signal processor device 407 (often referred to as a "microprocessor"). The electronic signal processor device 407 may, optionally, include an embodiment of a microelectronic device or a microelectronic device structure previously described herein (e.g., one or more of the microelectronic device 100 or the microelectronic device structure 130, 200, 300 previously described with reference to FIG. 1, FIG. 2, and FIG. 3A through FIG. 3T). The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
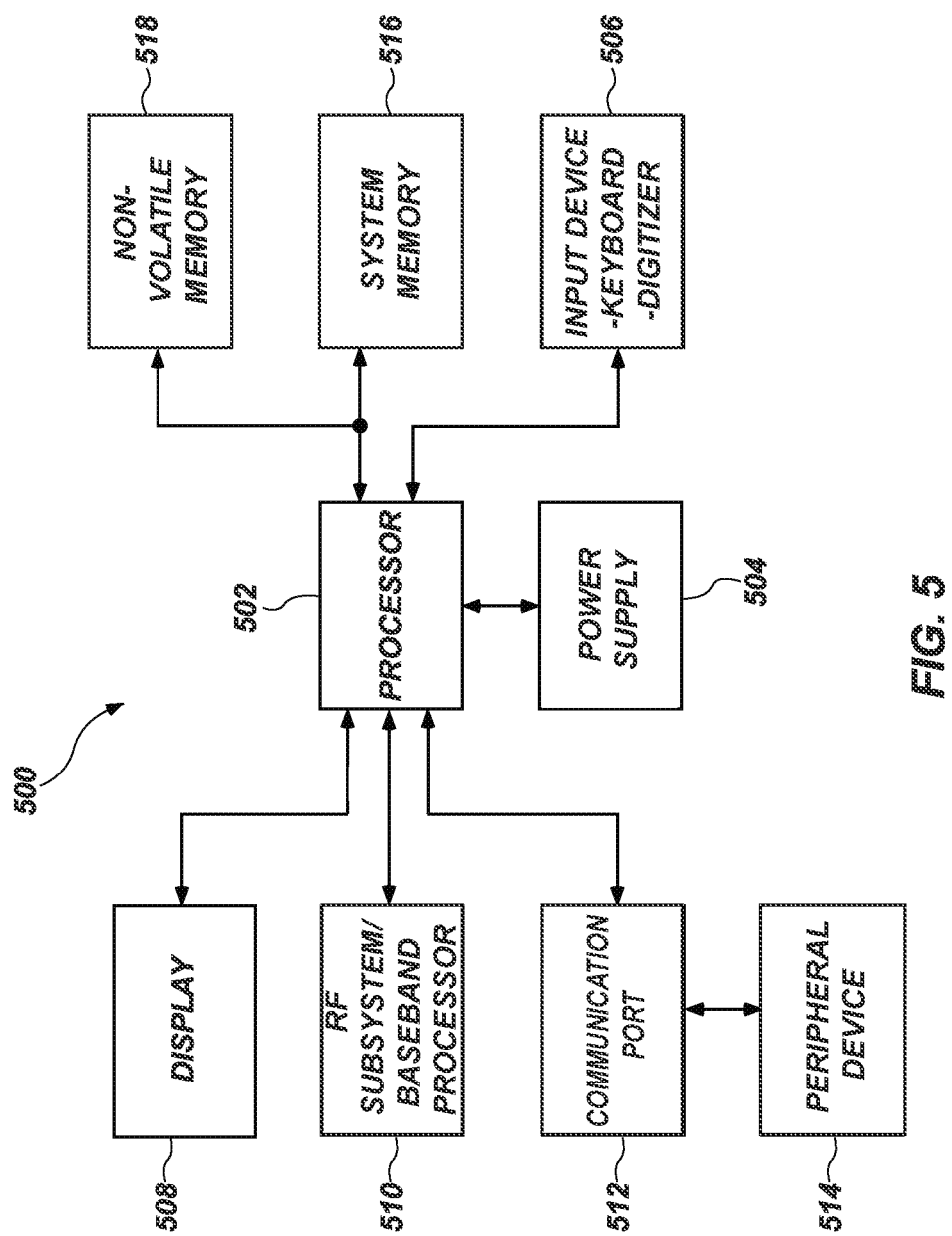
FIG. 5 is a processor-based system, in accordance with embodiments of the disclosure.

With reference to FIG. 5, depicted is a processor-based system 500. The processor-based system 500 may include various microelectronic devices and microelectronic device structures (e.g., microelectronic devices and microelectronic device structures including one or more of the microelectronic device 100 or the microelectronic device structure 130, 200, 300) manufactured in accordance with embodiments of the present disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices and microelectronic device structures (e.g., microelectronic devices and microelectronic device structures including one or more of the microelectronic device 100 or the microelectronic device structure 130, 200, 300) manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory, which may include one or more of spin torque transfer magnetic random-access memory (STT-MRAM), magnetic random-access memory (MRAM), dynamic random-access memory (DRAM), static random-access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices and microelectronic device structures (e.g., the microelectronic device 100 and the microelectronic device structure 130, 200, 300) described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices and microelectronic device structures (e.g., the microelectronic device 100 and the microelectronic device structure 130, 200, 300) described above, or a combination thereof.

Accordingly, in at least some embodiments, an electronic system comprises an input device, an output device, a processor device operably coupled to the input device and the output device, and a memory device operably coupled to the processor device and comprising at least one microelectronic device structure. The at least one microelectronic device structure comprises strings of memory cells extending through a stack structure comprising alternating levels of insulative structures and conductive structures, first support pillar structures within a first region of the stack structure vertically extending through the stack structure to a source structure underlying the stack structure and electrically isolated from the source structure, and second support pillar structures within a second region of the stack structure vertically extending through the stack structure and in electrical communication with the source structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A memory device, comprising:
   strings of memory cells extending through a stack structure comprising alternating levels of insulative structures and conductive structures;
   support pillar structures vertically extending through the stack structure to a source structure underlying the stack structure; and
   a bridge structure extending between at least some of the support pillar structures neighboring one another.

2. The memory device of claim 1, wherein the bridge structure and the at least some of the support pillar structures are electrically isolated from the source structure.

3. The memory device of claim 1, wherein the bridge structure comprises a material exhibiting a tensile stress less than a tensile stress of tungsten.

4. The memory device of claim 1, wherein the bridge structure comprises polysilicon.

5. The memory device of claim 1, further comprising a liner material between the bridge structure and the source structure.

6. The memory device of claim 1, wherein at least others of the support pillar structures are isolated from the bridge structure.

7. The memory device of claim 1, wherein:
   the at least some of the support pillar structures individually comprise a first material; and
   at least others of the support pillar structures individually comprise a second material comprising a different material composition than the first material.

8. The memory device of claim 7, wherein the bridge structure comprises the first material.

9. The memory device of claim 1, wherein the bridge structure horizontally extends within the source structure between the at least some of the support pillar structures neighboring one another.

10. The memory device of claim 1, further comprising a slot structure vertically extending through the stack structure to the bridge structure, the slot structure horizontally between the at least some of the support pillar structures neighboring one another.

11. A microelectronic device, comprising:
   a stack structure comprising tiers each comprising conductive material and insulative material vertically adjacent to the conductive material;

a source structure vertically underlying the stack structure;

a support pillar structure vertically extending through the stack structure to the source structure, the support pillar structure electrically isolated from the source structure; and an additional support pillar structure vertically extending through the stack structure and in electrical communication with the support pillar structure, the additional support pillar structure electrically isolated from the source structure.

12. The microelectronic device of claim 11, wherein the support pillar structure and the additional support pillar structure comprise substantially the same material.

13. The microelectronic device of claim 11, further comprising a further additional support pillar structure vertically extending through the stack structure, the further additional support pillar structure vertically extending farther into the source structure than the support pillar structure and the additional support pillar structure.

14. The microelectronic device of claim 11, further comprising a liner material within each of the support pillar structure and the additional support pillar structure, the liner material electrically isolating the support pillar structure and the additional support pillar structure from the source structure.

15. A microelectronic device, comprising:

a stack structure comprising alternating conductive structures and insulative structures arranged in tiers, the tiers individually comprising one of the conductive structures and one of the insulative structures;

a slot structure vertically extending through the stack structure; and multiple pairs of support pillar structures vertically extending through the stack structure, the slot structure horizontally intervening between and in electrical communication with horizontally neighboring support pillar structures of each of the multiple pairs of support pillar structures.

* * * * *

UNITED STATES PATENT AND TRADEMARK OFFICE
CERTIFICATE OF CORRECTION

PATENT NO. : 11,910,598 B2
APPLICATION NO. : 17/816299
DATED : February 20, 2024
INVENTOR(S) : Shuangqiang Luo, Indra V. Chary and Justin B. Dorhout It is certified that error appears in the above-identified patent and that said Letters Patent is hereby corrected as shown below:

In the Specification

| | | |
|---|---|---|
| Column 1, | Line 10, | change "No. 11,417,673 issued" to --No. 11,417,673, issued-- |
| Column 4, | Line 29, | change "not necessary limited" to --not necessarily limited-- |
| Column 9, | Lines 43-44, | change "and MgQ$_x$, at least" to --and MgO$_x$), at least-- |
| Column 13, | Line 7, | change "electrically conducive material," to --electrically conductive material,-- |
| Column 13, | Lines 15-16, | change "oxide (RUO$_x$), alloys" to --oxide (RuO$_x$), alloys-- |

Signed and Sealed this
Sixteenth Day of April, 2024

Katherine Kelly Vidal
*Director of the United States Patent and Trademark Office*